(12) United States Patent
Liu et al.

(10) Patent No.: US 12,414,305 B2
(45) Date of Patent: Sep. 9, 2025

(54) TRANSISTOR, MEMORY DEVICE AND MANUFACTURING METHOD OF MEMORY DEVICE

(71) Applicants: Taiwan Semiconductor Manufacturing Company, Ltd., Hsinchu (TW); National Yang Ming Chiao Tung University, Hsinchu (TW)

(72) Inventors: Po-Tsun Liu, Hsinchu (TW); Meng-Han Lin, Hsinchu (TW); Zhen-Hao Li, Tainan (TW); Tsung-Che Chiang, Taoyuan (TW); Bo-Feng Young, Taipei (TW); Hsin-Yi Huang, Taichung (TW); Sai-Hooi Yeong, Hsinchu County (TW); Yu-Ming Lin, Hsinchu (TW)

(73) Assignees: Taiwan Semiconductor Manufacturing Company, Ltd., Hsinchu (TW); National Yang Ming Chiao Tung University, Hsinchu (TW)

( * ) Notice: Subject to any disclaimer, the term of this patent is extended or adjusted under 35 U.S.C. 154(b) by 503 days.

(21) Appl. No.: 17/901,777

(22) Filed: Sep. 1, 2022

(65) Prior Publication Data
US 2024/0081077 A1 Mar. 7, 2024

(51) Int. Cl.
*H01L 27/11597* (2017.01)
*H01L 21/28* (2025.01)
*H01L 27/11587* (2017.01)
*H01L 27/1159* (2017.01)
*H01L 29/06* (2006.01)
(Continued)

(52) U.S. Cl.
CPC ............ *H10B 51/20* (2023.02); *H10B 51/10* (2023.02); *H10B 51/30* (2023.02); *H10D 30/0415* (2025.01); *H10D 30/43* (2025.01); *H10D 30/6729* (2025.01); *H10D 30/6735* (2025.01); *H10D 30/6739* (2025.01); *H10D 30/6757* (2025.01); *H10D 62/121* (2025.01); *H10D 64/033* (2025.01); *H10D 64/258* (2025.01)

(58) Field of Classification Search
CPC ........ H10B 51/20; H10B 51/10; H10B 51/30; H10D 30/0415; H10D 30/43; H10D 30/6729; H10D 30/6735; H10D 30/6739; H10D 30/6757; H10D 62/121; H10D 64/033; H10D 64/258; H10D 30/014; H10D 64/689; H10D 62/80; H10D 62/86; H10D 62/882; B82Y 10/00
USPC ....................................................... 257/295
See application file for complete search history.

(56) References Cited

U.S. PATENT DOCUMENTS 9,209,247 B2 12/2015 Colinge et al.
9,236,267 B2 1/2016 De et al.
(Continued)

*Primary Examiner* — Tong-Ho Kim
(74) *Attorney, Agent, or Firm* — JCIPRNET

(57) ABSTRACT

A transistor includes a first semiconductor layer, a second semiconductor layer, a semiconductor nanosheet, a gate electrode and source and drain electrodes. The semiconductor nanosheet is physically connected to the first semiconductor layer and the second semiconductor layer. The gate electrode wraps around the semiconductor nanosheet. The source and drain electrodes are disposed at opposite sides of the gate electrode. The first semiconductor layer surrounds the source electrode, the second semiconductor layer surrounds the drain electrode, and the semiconductor nanosheet is disposed between the source and drain electrodes.

20 Claims, 23 Drawing Sheets

(51) Int. Cl.

| | | |
|---|---|---|
| *H01L 29/417* | (2006.01) | |
| *H01L 29/423* | (2006.01) | |
| *H01L 29/49* | (2006.01) | |
| *H01L 29/66* | (2006.01) | |
| *H01L 29/775* | (2006.01) | |
| *H01L 29/786* | (2006.01) | |
| *H10B 51/10* | (2023.01) | |
| *H10B 51/20* | (2023.01) | |
| *H10B 51/30* | (2023.01) | |
| *H10D 30/01* | (2025.01) | |
| *H10D 30/43* | (2025.01) | |
| *H10D 30/67* | (2025.01) | |
| *H10D 62/10* | (2025.01) | |
| *H10D 64/01* | (2025.01) | |
| *H10D 64/23* | (2025.01) | |

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,355,019 B1 * | 7/2019 | Li ................... H10D 30/6745 |
| 2017/0365604 A1 * | 12/2017 | Suh ................... H10D 62/822 |
| 2020/0273998 A1 * | 8/2020 | Jambunathan ....... H10D 62/121 |
| 2022/0246769 A1 * | 8/2022 | Shimbo ............ H10D 30/6735 |

\* cited by examiner

TRANSISTOR, MEMORY DEVICE AND MANUFACTURING METHOD OF MEMORY DEVICE

BACKGROUND

As the size of the integrated circuit keeps decreasing, the integration density of the component or device gradually increases. Semiconductor memory devices include volatile memories and non-volatile memories. For semiconductor memory devices, the increased memory cell density leads to compact structure designs with reduced sizes but maintaining the performance of the semiconductor memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
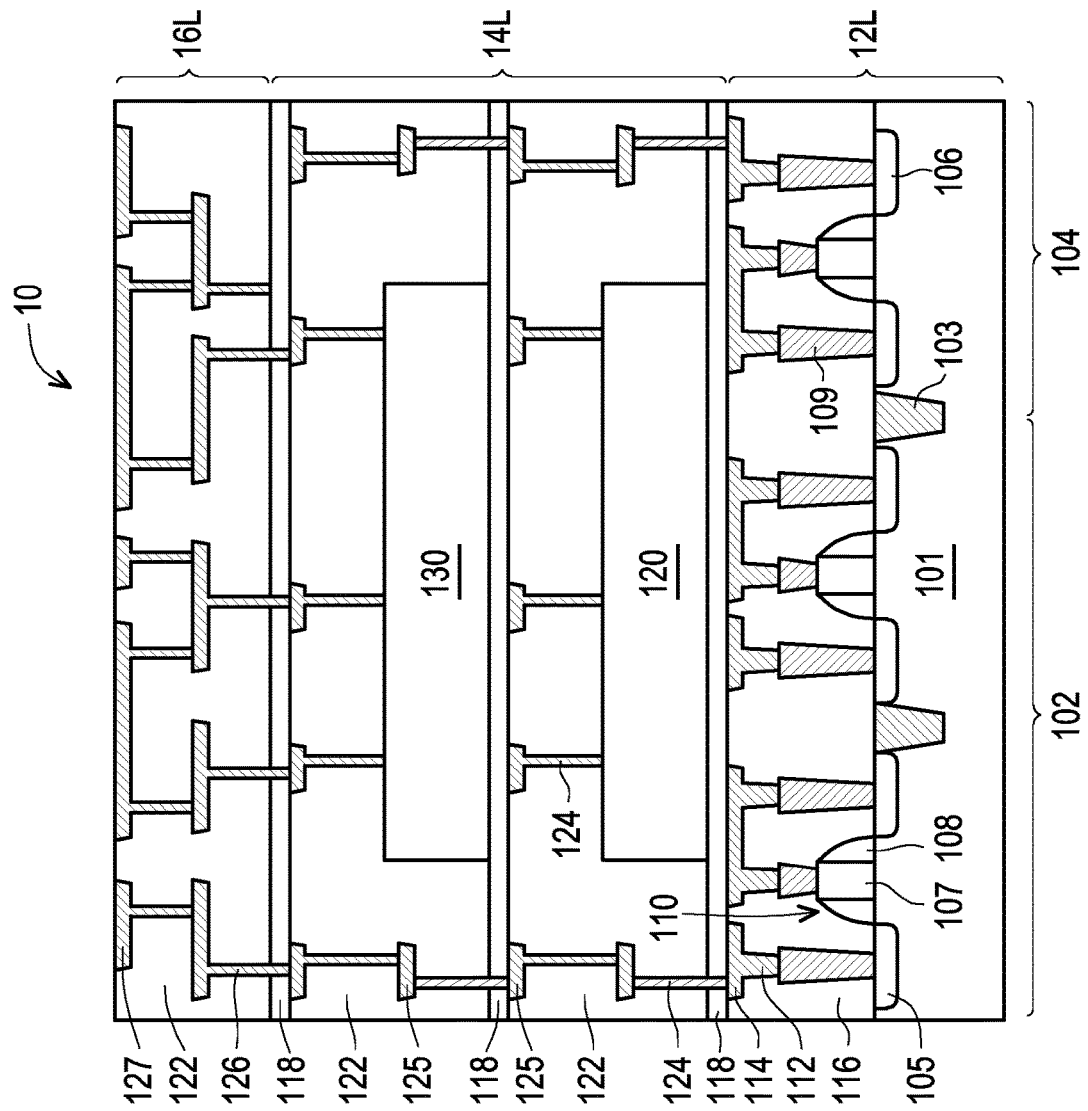
FIG. 1 illustrates a cross-sectional view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 1 illustrates a cross-sectional view of a semiconductor device 10 in accordance with some embodiments. In some embodiments, the semiconductor device 10 is formed with integrated memory devices 120 and 130. The semiconductor device 10 may include active devices 110 and memory devices 120, 130. The active devices 110 may be field effect transistor (FET) devices. In one embodiment, the active devices 110 are formed through the front-end-of-line (FEOL) manufacturing processes and include fin field effect transistors (FinFETs). The at least one of the memory devices 120, 130 may include ferroelectric random access memory (FeRAM) devices formed through the back-end-of-line (BEOL) manufacturing processes. It is understood that FinFETs are used as examples, and other kinds of FEOL devices such as planar transistors or gate-all-around (GAA) transistors may be used herein and included within the scope of the present disclosure. That is, the memory devices 120, 130 may be integrated with or in any suitable semiconductor devices. In FIG. 1, the details of the memory devices 120, 130 are not shown and further details will be described later in subsequent figures.

As illustrated in FIG. 1, the semiconductor device 10 includes different regions for forming different types of circuits. For example, the semiconductor device 10 includes a first region 102 for forming logic circuits and a second region 104 for forming peripheral circuits, input/output (I/O) circuits, electrostatic discharge (ESD) circuits, and/or analog circuits. The semiconductor device 10 may also include other regions for forming other types of circuits which are fully intended to be included within the scope of the present disclosure. The semiconductor device 10 includes a substrate 101. In some embodiments, the substrate 101 is a bulk substrate, such as a silicon substrate, doped or undoped, or an active layer of a semiconductor-on-insulator (SOI) substrate. In some embodiments, the substrate 101 includes other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. For example, additional electrical components, such as resistors, capacitors, inductors, diodes, or the like, is formed in or on the substrate 101 during the FEOL manufacturing processes.

As seen in FIG. 1, the active devices 110 are formed on the substrate 101, and isolation regions 103, such as shallow trench isolation (STI) regions, are formed between or around the active devices 110. In some embodiments, the active device 110 includes a gate electrode 107 and source and drain regions 105 and 106. The gate electrode 107 may be formed over the substrate 101 with gate spacers 108 along sidewalls of the gate electrode 107. The source and drain regions 105 and 106 such as doped or epitaxial source and drain regions are formed on opposing sides of the gate electrode 107. In some embodiments, conductive contacts 109, such as gate contacts and source/drain contacts, are formed over and electrically coupled to respective underlying electrically conductive features (e.g., gate electrodes 107 or source and drain regions 105 and 106). In some embodiments, a dielectric layer 116, such as an inter-layer dielectric (ILD) layer, is formed over the substrate 101 and covering the source and drain regions 105 and 106, the gate electrode 107 and the contacts 109, and other electrically conductive features, such as conductive interconnect structures including conductive vias 112 and conductive lines 114, are embedded in the dielectric layer 116. It is understood that the dielectric layer 116 may include more than one dielectric layers of the same or different dielectric materials. Collectively, the substrate 101, the active devices 110, the contacts 109, conductive features 112/114, and the dielectric layers 116 shown in FIG. 1 may be referred to as the front-end level 12L.

Referring to FIG. 1, dielectric layers 118 and dielectric layers 122 are formed over the dielectric layer 116 in alternation. In one embodiment, at least one of the dielectric layers 118 includes an etch stop layer (ESL). In some embodiments, the materials of the dielectric layers 118 is different from the materials of the dielectric layers 116 and 122. In some embodiments, the material of the dielectric layer(s) 118 includes silicon nitride or carbide formed by plasma-enhanced physical vapor deposition (PECVD). In some embodiments, one or more of the dielectric layers 118 is omitted. In some embodiments, the dielectric layers 116 and 122 is formed of any suitable dielectric material, such as silicon oxide, silicon nitride, silicon oxynitride, phosphosilicate glass (PSG), borosilicate glass (BSG), boron-doped phosphosilicate glass (BPSG), or low-k materials, formed by a suitable method, such as spin coating, physical vapor deposition (PVD), chemical vapor deposition (CVD), or the like. In FIG. 1, memory devices 120 and 130, each of which may include a plurality of memory cells, are formed in the dielectric layer 122 and coupled to electrically conductive features (e.g., conductive vias 124 and conductive lines 125) in the dielectric layer 122.

In FIG. 1, the memory devices 120 and 130 are formed at different layers of the dielectric layers 122. The memory device 120 is formed at the lower layer, and the memory device 130 is formed at the upper layer. In some embodiments, the memory devices 120 and 130 have the same or similar structure. In some embodiments, the memory devices 120 and 130 have different structure designs. Although two layers of memory devices are depicted in FIG. 1, other numbers of layers of memory devices, such as one layer, three layers, or more, are also possible and are encompassed within the scope of the present disclosure. Collectively, the layers of memory device 120 and 130 are referred to as the memory device level 14L or a memory region of the semiconductor device 10. The memory device level 14L may be formed in the BEOL processes of semiconductor manufacturing. The memory devices 120 and 130 may be formed in the BEOL processes at any suitable locations within the semiconductor device 10, such as over the first region 102, over the second region 104, or over a plurality of regions.

After the memory device level 14L is formed, an interconnect level 16L including electrically conductive interconnecting features (e.g., conductive vias 126 and conductive lines 127) embedded in the dielectric layer(s) 122 is formed over the memory device level 14L. Any suitable methods may be employed to form the interconnect level 16L, and the details are not described herein. In some embodiments, the interconnect level 16L is electrically connect the electrical components formed in/on the substrate 101 to form functional circuits. In some embodiments, the interconnect structure 16L is also electrically coupled the memory devices 120, 130 to the active devices 110 and/or the components in/on the substrate 101. In addition, the memory devices 120 and 130 may be electrically coupled to an external circuit or an external device through the structure of the interconnect level 16L. In some embodiments, the memory devices 120 and 130 are electrically coupled to the active devices 110 of the front-end level 12L and/or other electrical components formed in the substrate 101, and are controlled or accessed (e.g., written to or read from) by functional circuits of the semiconductor device 10. Alternatively, the memory devices 120, 130 are electrically coupled to (e.g., controlled or accessed) an external circuit of another semiconductor device through the structure of the interconnect level 16L.

Figure 2A:
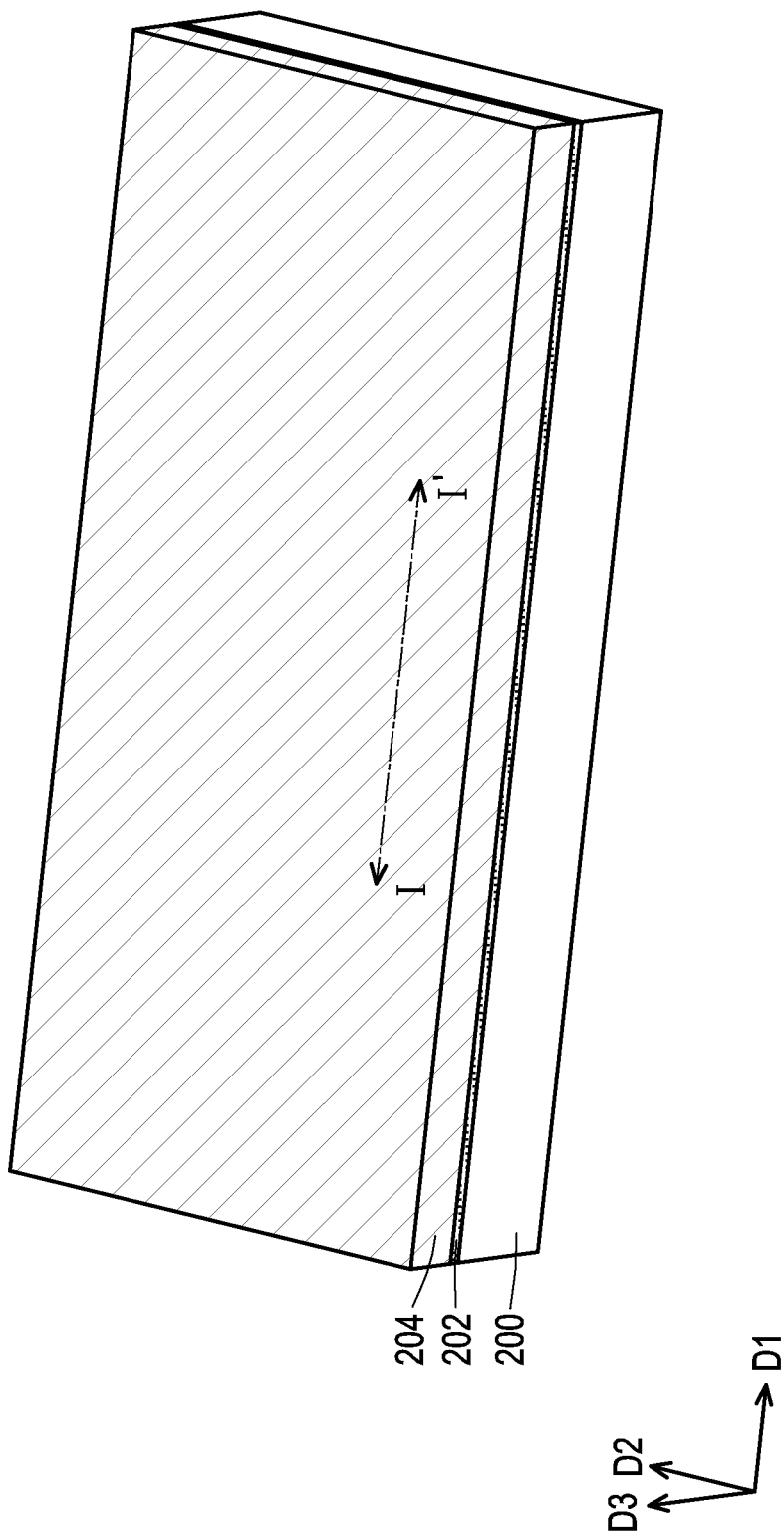
FIG. 2A to FIG. 2I are three dimensional views illustrating various stages of a manufacturing method of a memory device.
Figure 2B:
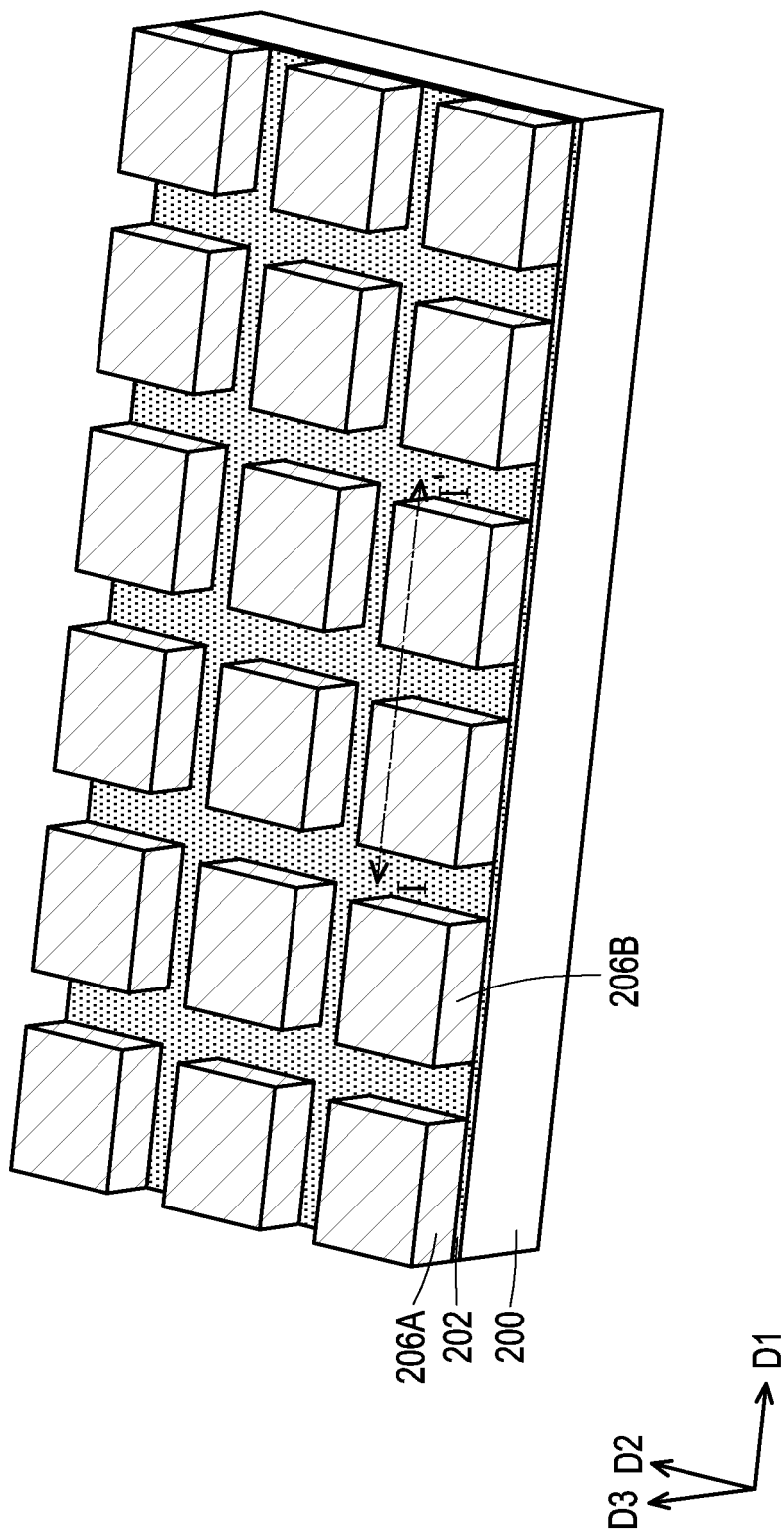
Figure 2C:
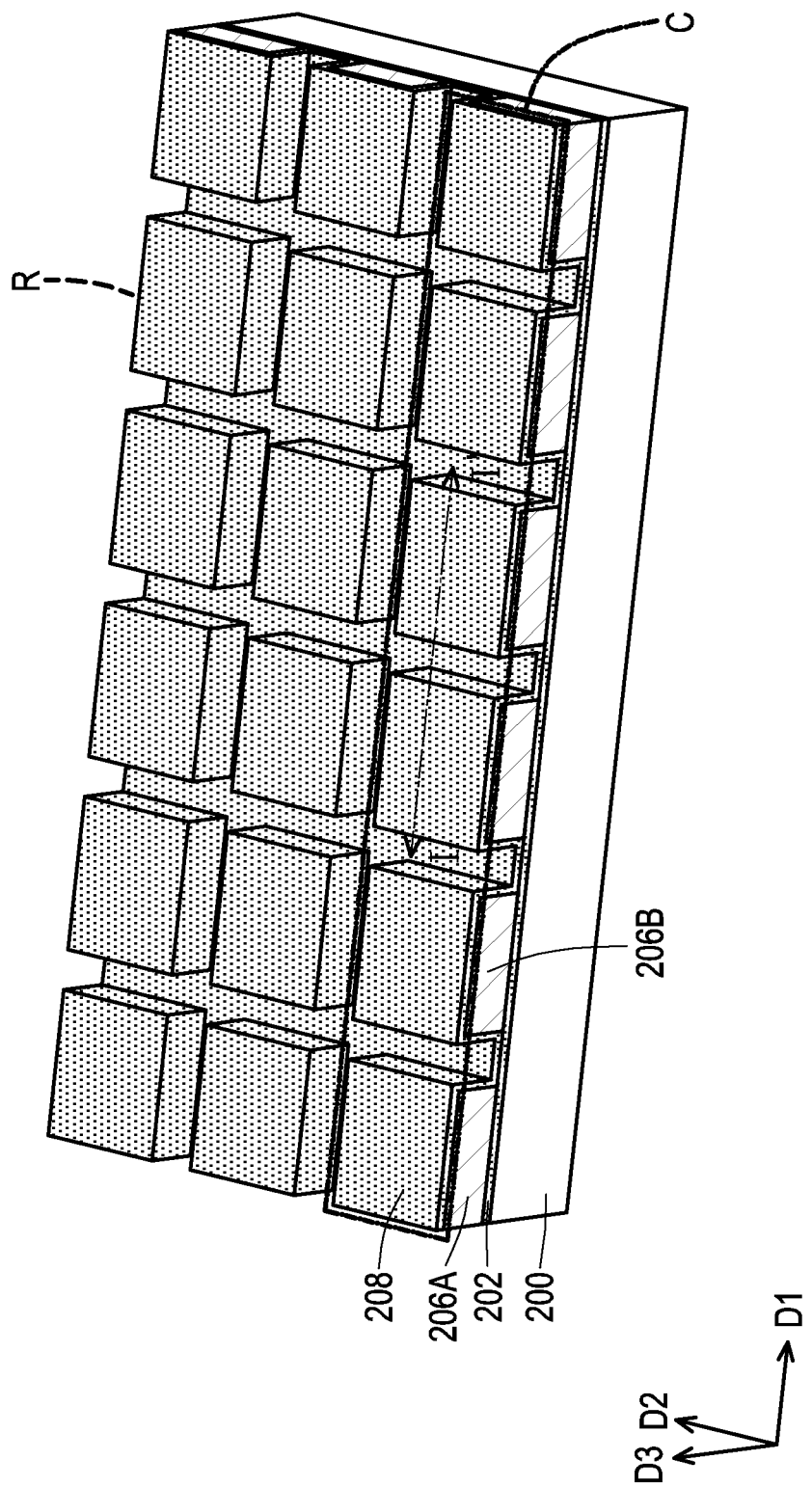
Figure 2D:
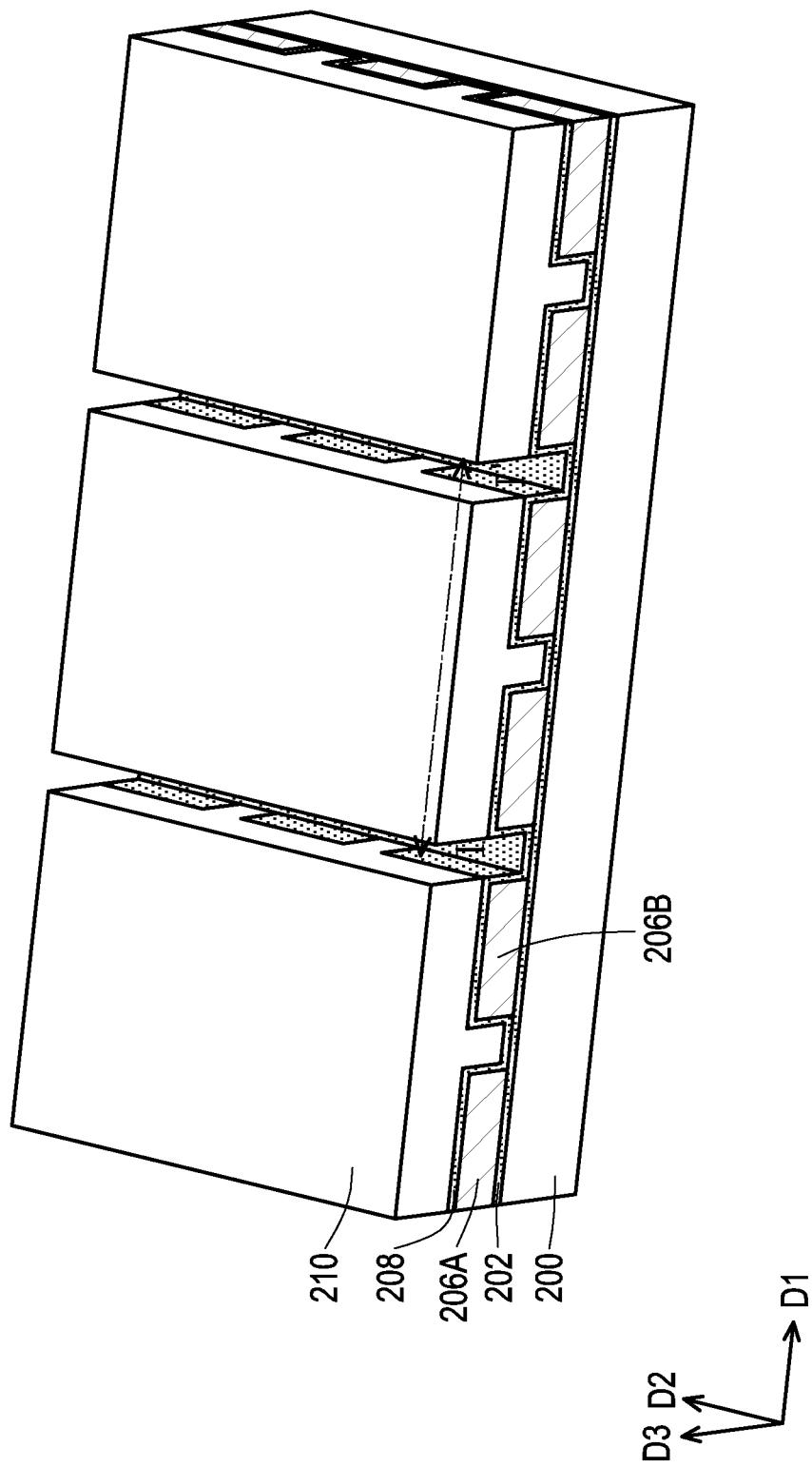
Figure 2E:
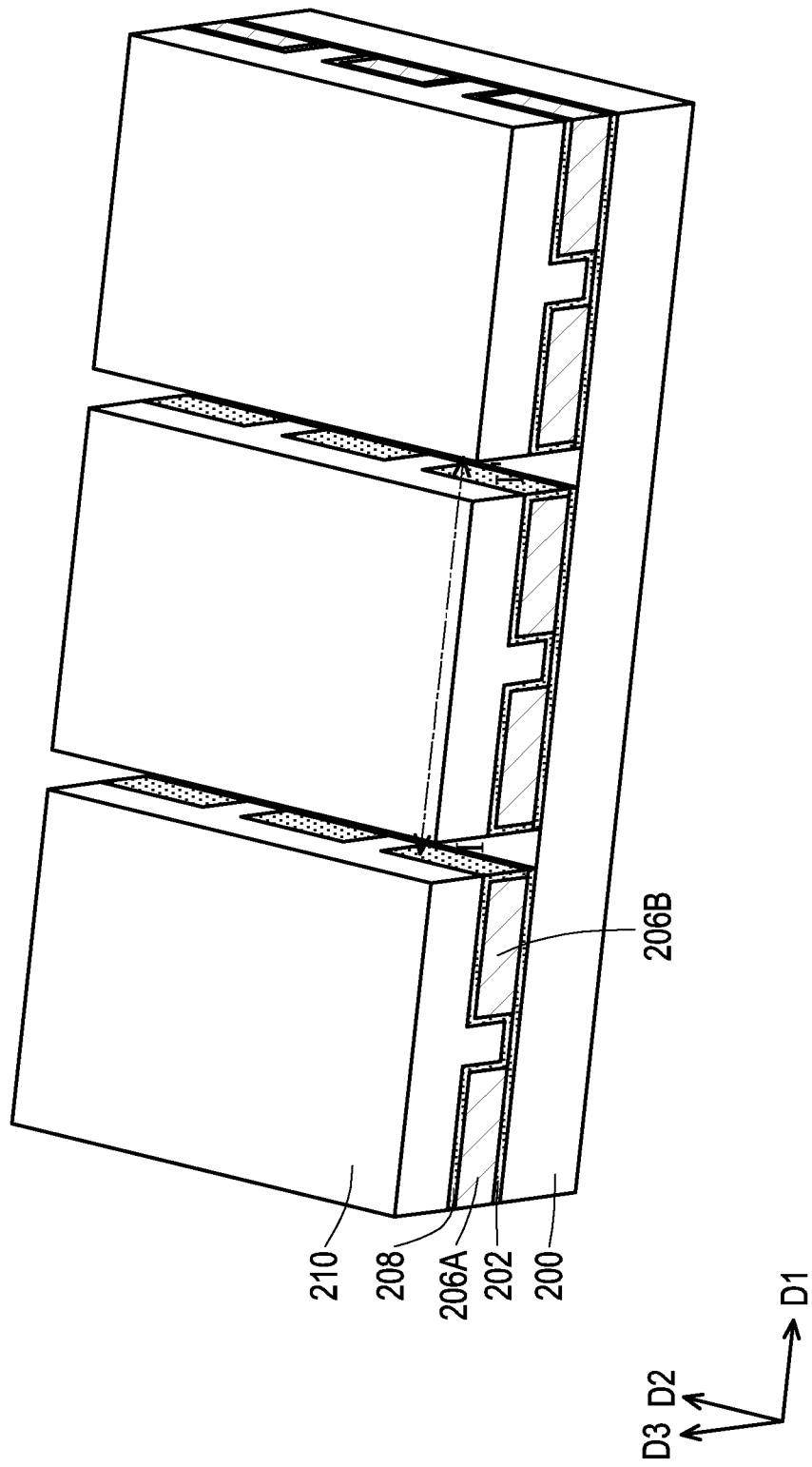
Figure 2F:
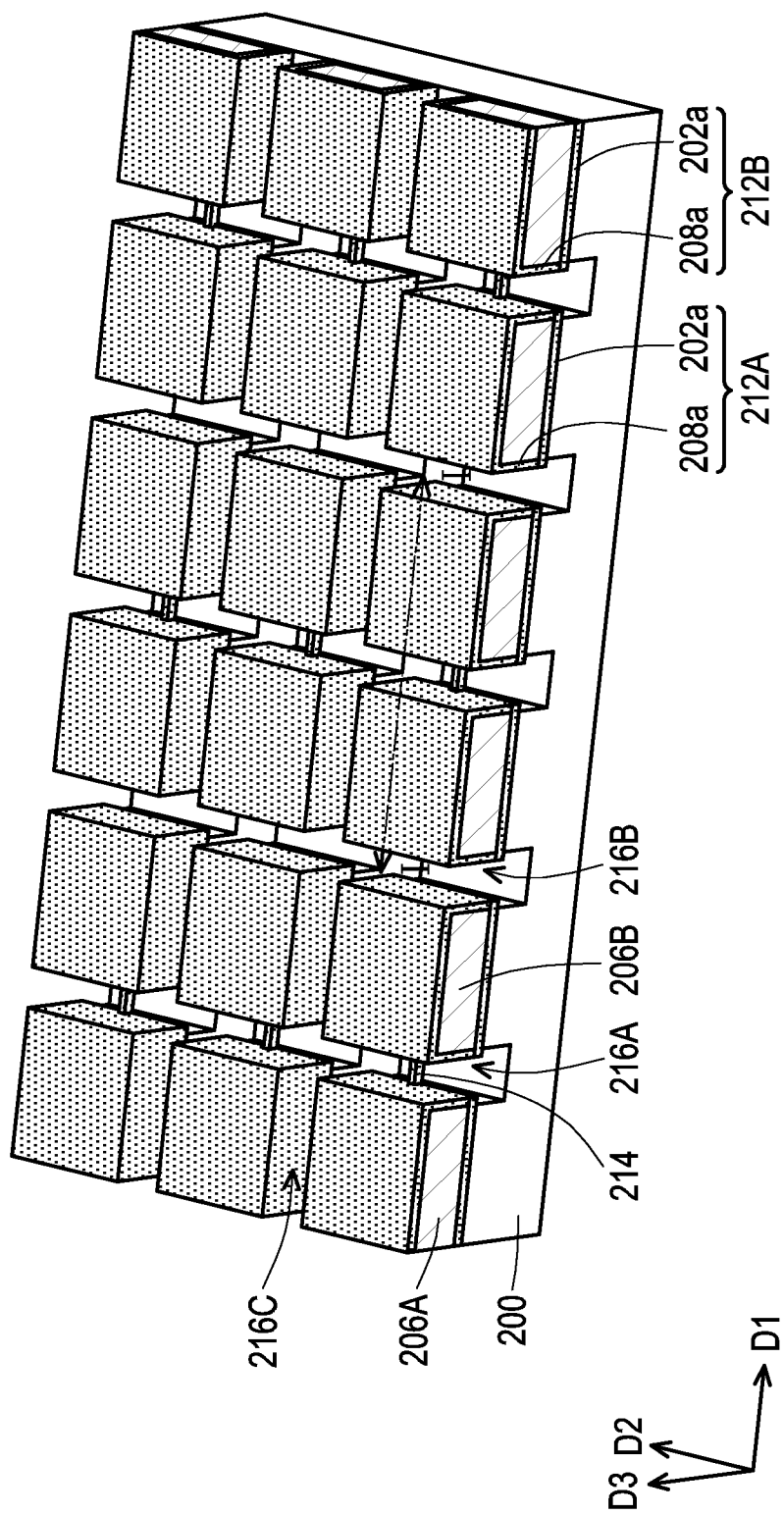
Figure 2G:
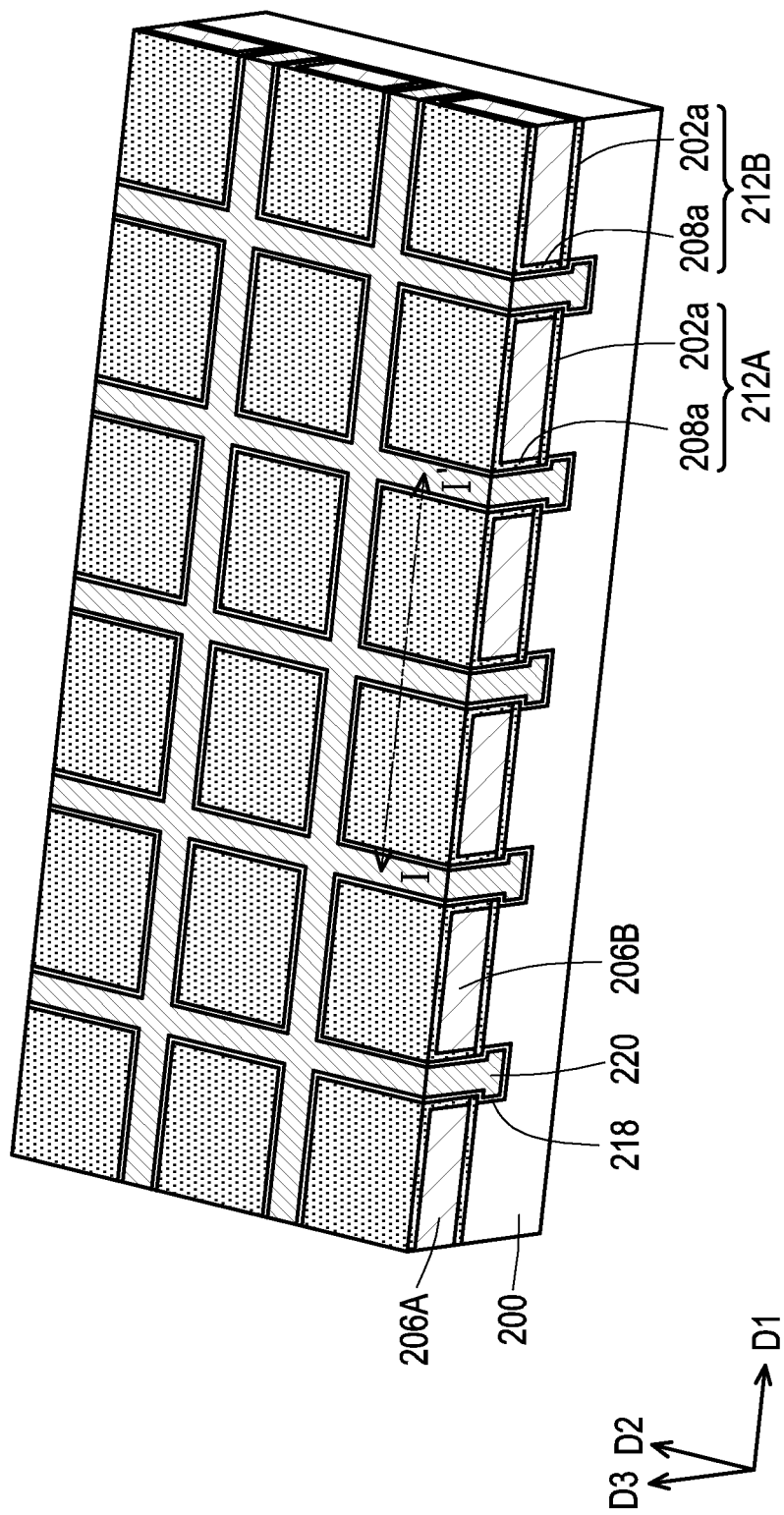
Figure 2H:
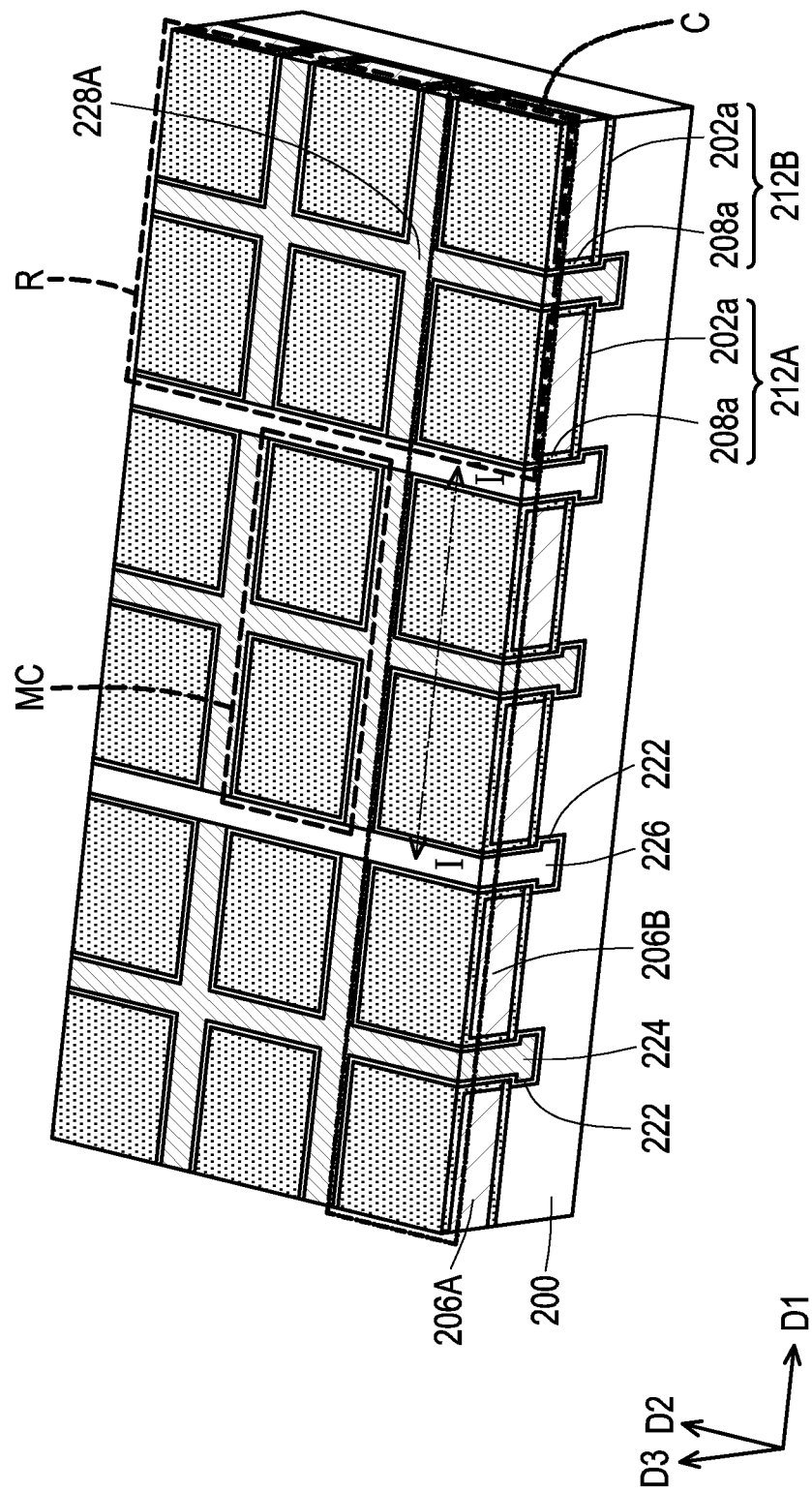

FIG. 2A to FIG. 2I are three dimensional views illustrating various stages of a manufacturing method of a memory device. FIG. 3A to FIG. 3I are cross-sectional views taken along cross section line I-I' in FIG. 2A to FIG. 2I. FIG. 4A is a perspective three dimensional view of a portion of FIG. 2H, and FIG. 4B is a cross-sectional view taken along cross section line II-II' in FIG. 4A. According to some embodiments, the memory device may be a three-dimensional (3D) memory device with a ferroelectric material. The memory devices depicted in the following paragraphs may be used as the memory devices 120 and 130 in FIG. 1.

Figure 3A:
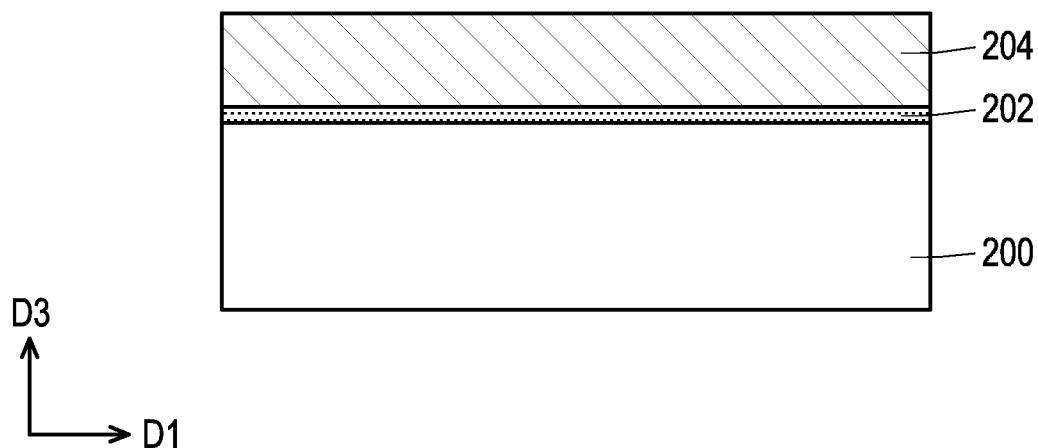
FIG. 3A to FIG. 3I are cross-sectional views taken along cross section line I-I' in FIG. 2A to FIG. 2I.
Figure 4A:
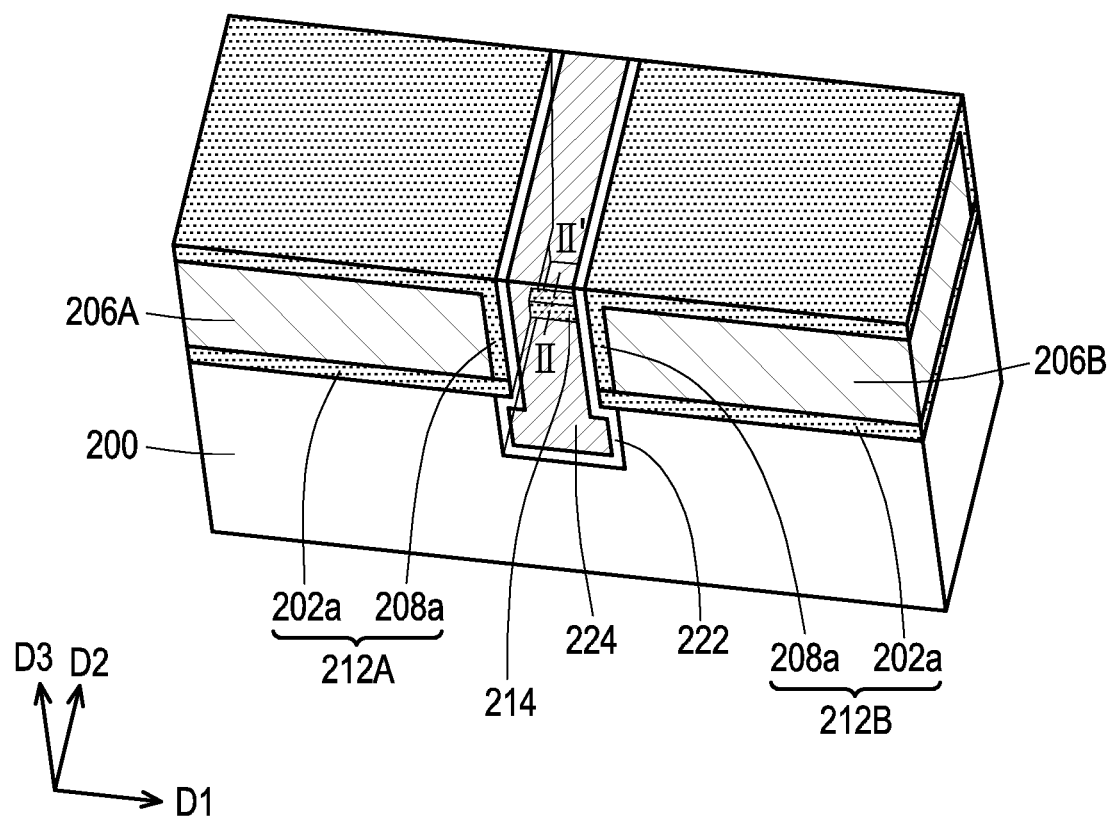
FIG. 4A is a perspective three dimensional view of a portion of FIG. 2H.
Figure 4B:
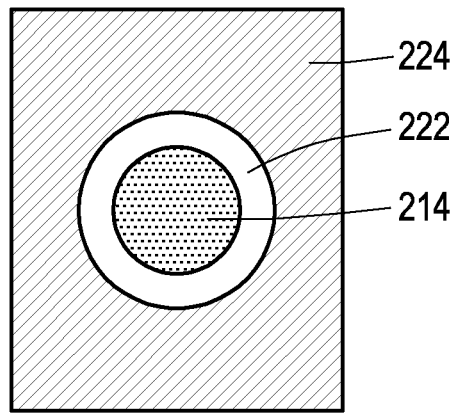
FIG. 4B is a cross-sectional view taken along a cross section line II-II' in FIG. 4A.

Referring to FIG. 2A and FIG. 3A, a semiconductor material 202 is formed on a dielectric layer 200. In some embodiments, the dielectric layer 200 is the dielectric layer(s) 122 in the memory device level 14L of FIG. 1, so the detailed description thereof is omitted herein. The dielectric layer 200 is formed over the front-end level 12L. The dielectric layer 200 may be a single layer or multiple layers. In some embodiments, the dielectric layer 200 is also referred to as a buffer layer. A material of the dielectric layer 200 is not particularly limited, as long as said material renders good etching selectivity between the semiconductor material 202 and the dielectric layer 200 and between a semiconductor material 208 (described below) and the dielectric layer 200. For example, the dielectric layer 200 is made of polyimide, epoxy resin, acrylic resin, phenol resin, BCB, PBO, silicon oxide, silicon nitride, or any other suitable polymer-based dielectric material.

In some embodiments, the semiconductor material 202 is made of a first conductive type oxide semiconductor material. The first conductive type is n-type or p-type. In some embodiments, the semiconductor material 202 includes n-type amorphous oxide semiconductor such as amorphous indium tungsten oxide (a-IWO), amorphous indium zinc oxide (a-IZO), amorphous indium-tungsten-zinc oxide (a-IWZO), amorphous indium-tin-zinc oxide (a-ITZO), amorphous indium tin oxide (a-ITO), amorphous indium oxide (a-InO) material, the like, or a combination thereof. In alternative embodiments, the semiconductor material 202 includes p-type oxide based material such as $SnO_x$, $Cu_xO$ (e.g., $Cu_2O$, $CuFeO_2$, $Cu_{15}Fe_3O_2$), $NiO_x$, Ni(Sn)O, the like, or a combination thereof. In some embodiments, the semiconductor material 202 is doped with a first conductive type dopant. For example, the semiconductor material 202 is doped with p-type dopants, such as boron, $BF_2$, the like, or a combination thereof, or doped with n-type dopants, such as phosphorus, arsenic, the like, or a combination thereof. In some embodiments, the semiconductor material 202 includes IV element such as Ge, Si—Ge, Ge—Si, SiC or Ge—Sn, a compound such as GaN, GaAs, GaP, GaSb, InN, InAs, InSb, BN, BP, AlN, AlP, AlAs, AlSb, CdSe, CdS, CdTe, ZnS or ZnTe, 2D material such as graphene, $MoS_2$, MoTe, MoSe, $WSe_2$, $WS_2$, h-BN or $PbI_2$, the like, or a combination thereof. In some embodiments, an etching selectivity between the semiconductor material 202 and the dielectric layer 200 is high. For example, the etching selectivity between the semiconductor material 202 and the dielectric layer 200 ranges between 1:10 and 1:10000. Herein, the etching selectivity is denoted by a ratio between an etch rate of the semiconductor material 202 and the dielectric layer 200. In some embodiments, the semiconductor material 202 is made of a single layer having one of the foregoing materials. However, the disclosure is not limited thereto. In some alternative embodiments, the semiconductor material 202 is made of a laminate structure of at least two of the foregoing materials. In some embodiments, the semiconductor material 202 is deposited on the dielectric layer 200 through ALD, CVD, PVD, or the like. In some embodiments, a thickness of the semiconductor material 202 is in a range of 0.5 nm to 10 nm.

Then, a conductive material 204 is formed on the semiconductor material 202 over the dielectric layer 200. In some embodiments, the conductive material 204 includes cobalt, tungsten, copper, titanium, tantalum, aluminum, zirconium, hafnium, the like, a combination thereof, or other suitable conductive materials. In some embodiments, the conductive material 204 is formed through CVD, ALD, plating, or other suitable deposition techniques. In some embodiments, a barrier layer (not shown) is optionally formed between the conductive material 204 and the semiconductor material 202, so as to avoid diffusion of atoms between elements. The barrier layer includes, for example, TiN, TaN, TiSiN, TaSiN, WSiN, TiC, TaC, TiAlC, TaAlC, TiAlN, TaAlN, or a combination thereof.

Figure 3B:
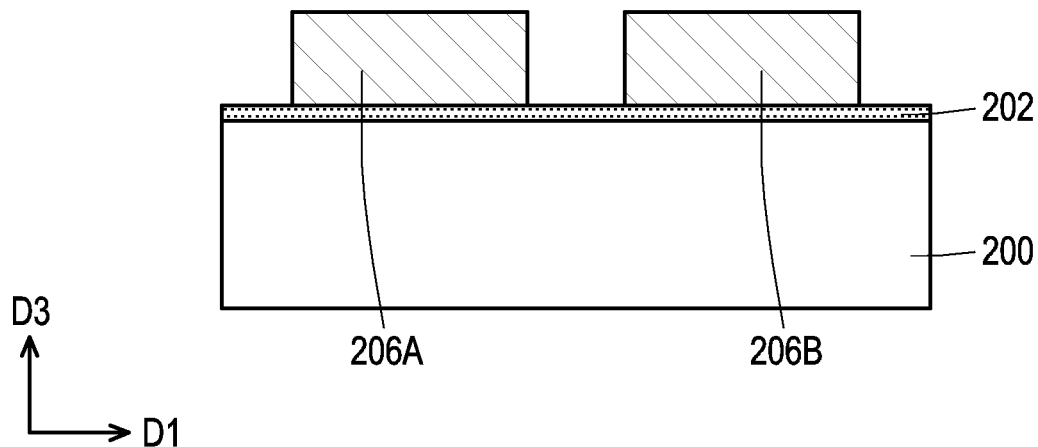

Referring to FIG. 2B and FIG. 3B, the conductive material 204 is patterned, to form a plurality of source and drain electrodes 206A and 206B. For example, portions of conductive material 204 are removed to expose the underlying semiconductor material 202. In some embodiments, the conductive material 204 is patterned through a lithography process and an etching process by using a mask. The lithography process includes, for example, photoresist coating, soft baking, exposing, post-exposure baking (PEB), developing, and hard baking. The etching process includes, for example, an anisotropic etching process such as dry etch or an isotropic etching process such as wet etch.

One of the source and drain electrodes 206A and 206B is a source electrode (e.g., source electrode 206A), and the other of the source and drain electrodes 206A and 206B is a drain electrode (e.g., drain electrode 206B), and vice versa. In some embodiments, the source and drain electrodes 206A and 206B are physically separated from each other. In some embodiments, the adjacent source and drain electrodes 206A and 206B arranged along a direction D1 are paired, and thus are also referred to as a pair of source and drain electrodes 206A and 206B. In some embodiments, plural pairs of source and drain electrodes 206A and 206B are arranged in an array having a plurality of rows R arranged along the direction D1 and a plurality of columns C arranged along a direction D2 substantially perpendicular to the direction D1. For example, each row R of the array has plural pairs of source and drain electrodes 206A and 206B arranged along the direction D2, and each column of the array has plural pairs of source and drain electrodes 206A and 206B arranged along the direction D1. The direction D1 and the direction D2 are, for example, substantially perpendicular to a stacking direction D3 of the dielectric layer 200, the semiconductor material 202 and the source and drain electrodes 206A and 206B. For example, the direction D1 is x-direction, the direction D2 is y-direction, and the direction D3 is z-direction. The source and drain electrodes 206A and 206B cover portions of the semiconductor material 202 while portions of the semiconductor material 202 between the source and drain electrodes 206A and 206B are exposed. In some embodiments, the source electrodes 206A are also referred to as source lines, and the drain electrodes 206B are also referred to as bit lines.

Figure 3C:
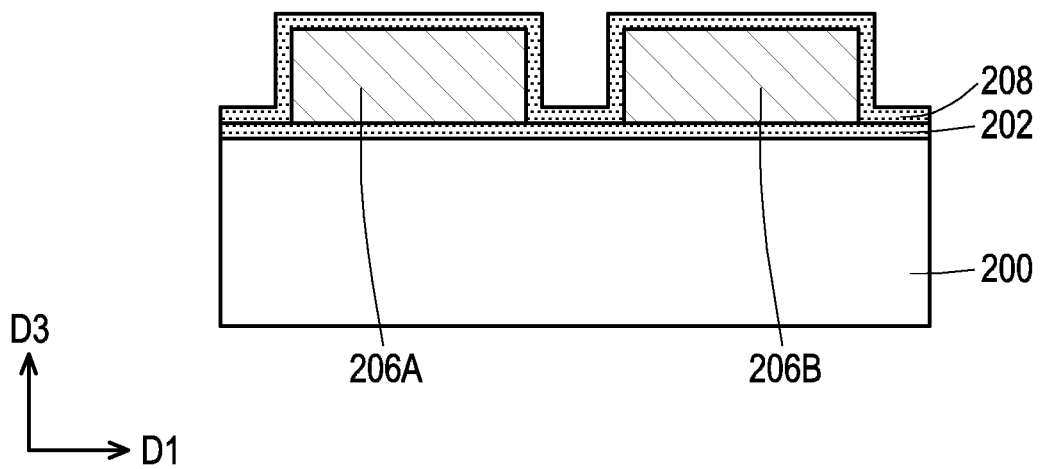

Referring to FIG. 2C and FIG. 3C, a semiconductor material 208 is formed over the semiconductor material 202, to cover the source and drain electrodes 206A and 206B and the exposed semiconductor material 202. In some embodiments, the semiconductor material 208 has the same material of the semiconductor material 202. In alternative embodiments, the semiconductor material 208 has different material from the semiconductor material 202 as long as they have the same conductive type. In some embodiments, the semiconductor material 208 is made of a first conductive type oxide semiconductor material. The first conductive type is n-type or p-type. In some embodiments, the semiconductor material 208 includes n-type amorphous oxide semiconductor such as amorphous indium tungsten oxide (a-IWO), amorphous indium zinc oxide (a-IZO), amorphous indium-tungsten-zinc oxide (a-IWZO), amorphous indium-tin-zinc oxide (a-ITZO), amorphous indium tin oxide (a-ITO), amorphous indium oxide (a-InO) material, the like, or a combination thereof. In alternative embodiments, the semiconductor material 208 includes p-type oxide based material such as $SnO_x$, $Cu_xO$ (e.g., $Cu_2O$, $CuFeO_2$, $Cu_{15}Fe_3O_2$), $NiO_x$, Ni(Sn)O, the like, or a combination thereof. In some embodiments, the semiconductor material 208 is doped with a first conductive type dopant. For example, the semiconductor material 208 is doped with p-type dopants, such as boron, $BF_2$, the like, or a combination thereof, or doped with n-type dopants, such as phosphorus, arsenic, the like, or a combination thereof. In some embodiments, the semiconductor material 208 includes IV element such as Ge, Si—Ge, Ge—Si, SiC or Ge—Sn, a compound such as GaN, GaAs, GaP, GaSb, InN, InAs, InSb, BN, BP, AlN, AlP, AlAs, AlSb, CdSe, CdS, CdTe, ZnS or ZnTe, 2D material such as graphene, $MoS_2$, MoTe, MoSe, $WSe_2$, $WS_2$, h-BN or $PbI_2$, the like, or a combination thereof. In some embodiments, an etching selectivity between the semiconductor material 208 and the dielectric layer 200 is high. For example, the etching selectivity between the semiconductor material 208 and the dielectric layer 200 ranges between 1:10 and 1:10000. Herein, the etching selectivity is denoted by a ratio between an etch rate of the semiconductor material 202 and the dielectric layer 200. In some embodiments, the semiconductor material 208 is made of a single layer having one of the foregoing materials. However, the disclosure is not limited thereto. In some alternative embodiments, the semiconductor material 208 is made of a laminate structure of at least two of the foregoing materials. In some embodiments, the semiconductor material 208 is deposited on the dielectric layer 200 through ALD, CVD, PVD, or the like. In some embodiments, a thickness of the semiconductor material 208 is in a range of 0.5 nm to 10 nm.

In some embodiments, the semiconductor material 208 is conformally formed on the source and drain electrodes 206A and 206B and the exposed semiconductor material 202. For example, the semiconductor material 208 is continuously disposed on and in direct contact with all exposed surfaces of the source and drain electrodes 206A and 206B and the semiconductor material 202. In some embodiments, the semiconductor material 208 surrounds the source and drain electrodes 206A and 206B.

Figure 3D:
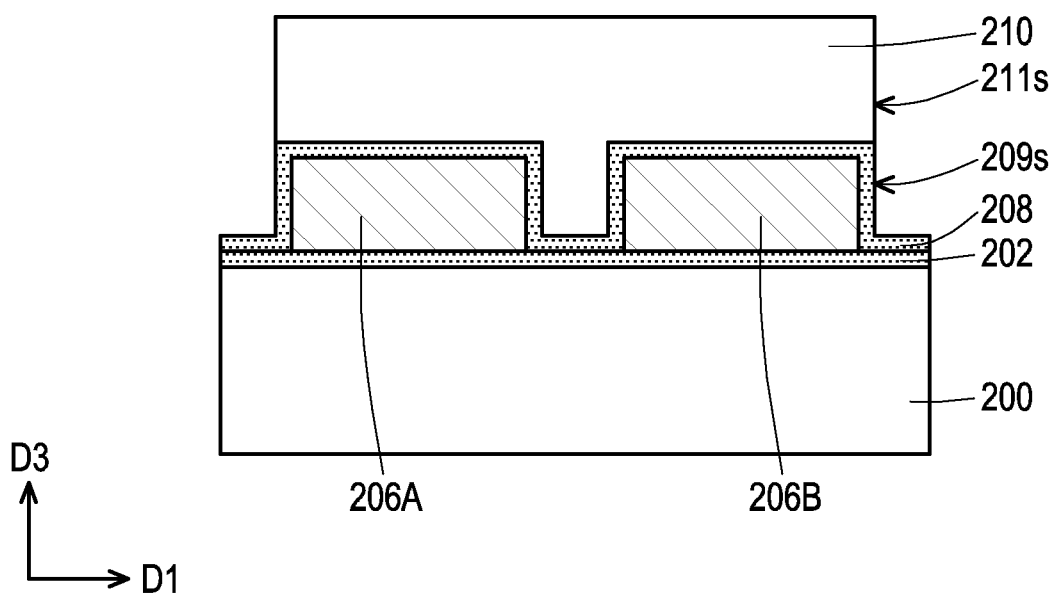

Referring to FIG. 2D, FIG. 2E, FIG. 3D and FIG. 3E, portions of the semiconductor materials 202 and 208 between the source and drain electrodes 206A and 206B are removed. In some embodiments, the semiconductor materials 202 and 208 are partially removed through an etching process by using a patterned photoresist layer 210. In some embodiments, as shown in FIG. 2D and FIG. 3D, the patterned photoresist layer 210 is formed on the semiconductor material 208, to cover the source and drain electrodes 206A and 206B and regions respectively between a pair of source and drain electrodes 206A and 206B. As shown in FIG. 2D, the patterned photoresist layer 210 may cover plural pairs of source and drain electrodes 206A and 206B in the same row R, and expose the semiconductor material 208 between adjacent rows R. For example, as shown in FIG. 3D, sidewalls 211s of the patterned photoresist layer 210 are substantially flush with sidewalls 209s of the semiconductor material 208.

Figure 3E:
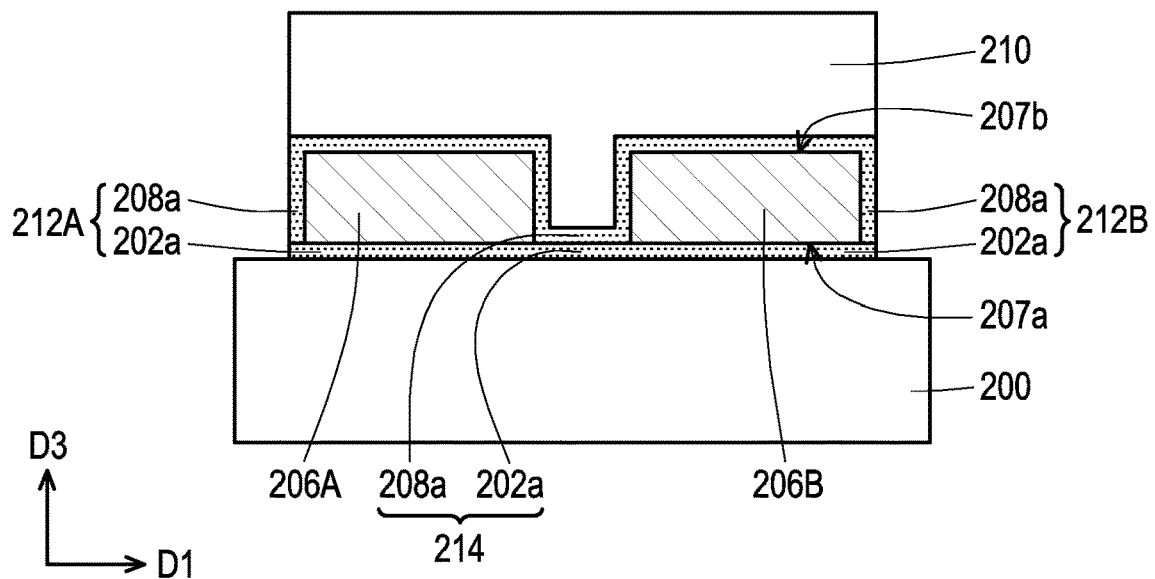

Then, as shown in FIG. 2E and FIG. 3E, by using the patterned photoresist layer 210 as a mask, portions of the semiconductor materials 202 and 208 are removed, to form a semiconductor layer 212A, a semiconductor layers 212B and a semiconductor nanosheet 214. In some embodiments, the semiconductor layer 212A surrounds one of a pair of source and drain electrodes 206A and 206B, the semiconductor layers 212B surrounds the other of a pair of source and drain electrodes 206A and 206B and the semiconductor nanosheet 214 is disposed between a pair of source and drain electrodes 206A and 206B. For example, the semiconductor layer 212A surrounds the source electrode 206A while the semiconductor layer 212B surrounds the drain electrode, and vice versa. In some embodiments, the semiconductor materials 202 and 208 are removed through an etching process. The etching process includes, for example, an isotropic etching process such as wet etch or an anisotropic etching process such as dry etch. In some embodiments, an etchant for the wet etch includes a combination of hydrogen fluoride (HF) and ammonia (NH$_3$), a combination of HF and tetramethylammonium hydroxide (TMAH), or the like. On the other hand, the dry etch process includes, for example, reactive ion etch (RIE), inductively coupled plasma (ICP) etch, electron cyclotron resonance (ECR) etch, neutral beam etch (NBE), and/or the like.

In some embodiments, the semiconductor layer 212A, the semiconductor layer 212B and the semiconductor nanosheet 214 are respectively include a semiconductor layer 202a and a semiconductor layer 208a. For example, the semiconductor layer 202a of the semiconductor layer 212A is disposed at a first surface (e.g., bottom surface) 207a of one (e.g., the source electrode 206A) of a pair of source and drain electrodes 206A and 206B, and the semiconductor layer 208a of the semiconductor layer 212A is disposed at a second surface (e.g., top surface) 207b opposite to the first surface of the one (e.g., source electrode 206A) of the pair of source and drain electrodes 206A and 206B and on sidewalls between the first and second surfaces 207a and 207b. Similarly, the semiconductor layer 202a of the semiconductor layer 212B is disposed at a first surface (e.g., bottom surface) 207a of the other (e.g., drain electrode 206B) of the pair of source and drain electrodes 206A and 206B, and the semiconductor layer 208a of the semiconductor layer 212B is disposed at a second surface (e.g., top surface) 207b opposite to the first surface of the other (e.g., drain electrode 206B) of the pair of source and drain electrodes 206A and 206B and on sidewalls between the first and second surfaces 207a and 207b. In other words, one of a pair of source and drain electrodes 206A and 206B is surrounded by the semiconductor layer 212A, and the other of the pair of source and drain electrodes 206A and 206B is surrounded by the semiconductor layer 212B. The semiconductor nanosheet 214 includes the semiconductor layer 202a and the semiconductor layer 208a on the semiconductor layer 202a, for example.

In some embodiments, the semiconductor layer 202a is continuously formed on a pair of source and drain electrodes 206A and 206B and the region between the pair of source and drain electrodes 206A and 206B, and the semiconductor layer 208a is also continuously formed below a pair of source and drain electrodes 206A and 206B and the region between the pair of source and drain electrodes 206A and 206B. In some embodiments, the semiconductor layer 212A and the semiconductor layer 212B are physically connected by the semiconductor nanosheet 214 therebetween. In some embodiments, the semiconductor layer 212A, the semiconductor nanosheet 214 and the semiconductor layer 212B are continuous and thus may be referred to as a semiconductor structure (or a channel structure), and the source and drain electrodes 206A and 206B are embedded in the semiconductor structure. In an embodiment in which the semiconductor layer 202a and the semiconductor layer 208a have the same material, an interface does not exist between the semiconductor layer 202a and the semiconductor layer 208a. For example, the semiconductor layer 202a and the semiconductor layer 208a are integrally formed. On contrary, in an embodiment in which the semiconductor layer 202a and the semiconductor layer 208a have different materials, an interface may exist between the semiconductor layer 202a and the semiconductor layer 208a.

Figure 3F:
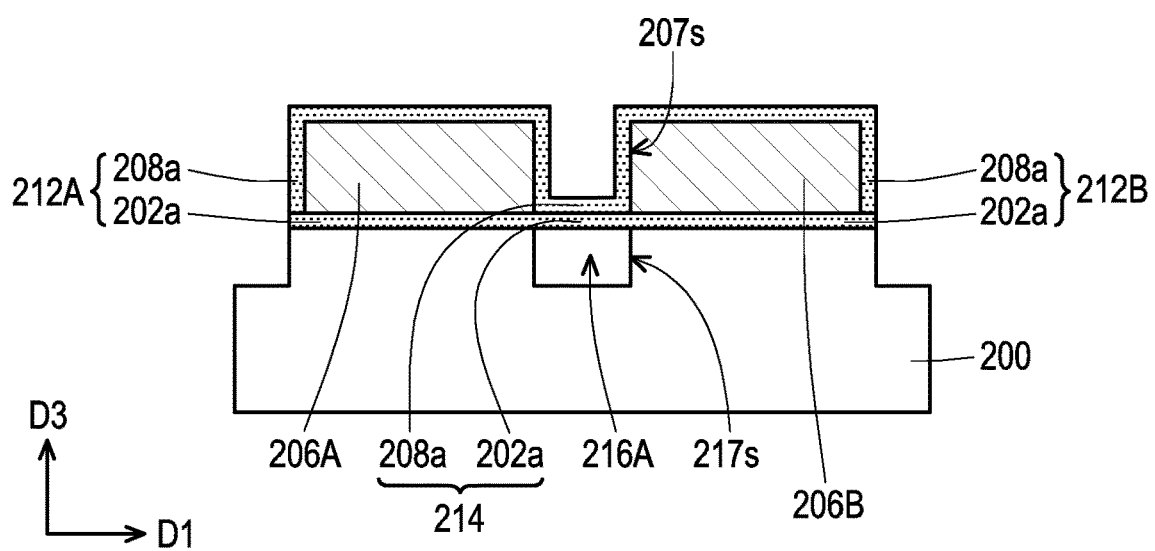

Referring to FIG. 2F and FIG. 3F, portions of the dielectric layer 200 are removed, to form trenches 216A, 216B and 216C. In some embodiments, with the patterned photoresist layer 210, the dielectric layer 200 is partially removed through an etching process. The etching process includes, for example, an isotropic etching process such as wet etch or an anisotropic etching process such as dry etch. In some embodiments, an etchant for the wet etch includes a combination of hydrogen fluoride (HF) and ammonia (NH$_3$), a combination of HF and tetramethylammonium hydroxide (TMAH), or the like. On the other hand, the dry etch process includes, for example, reactive ion etch (RIE), inductively coupled plasma (ICP) etch, electron cyclotron resonance (ECR) etch, neutral beam etch (NBE), and/or the like. As mentioned above, the etching selectivity between the semiconductor layer 202a and the dielectric layer 200 and between the semiconductor layer 208a and the dielectric layer 200 is high. Therefore, during the etching process, the etchant may selectively remove the dielectric layer 200 without damaging the exposed semiconductor layer 212A, semiconductor layer 212B and semiconductor nanosheet 214. Then, the patterned photoresist layer 210 is removed by a removal process such as an ashing process.

In some embodiments, the trench 216A is formed between the source electrodes 206A and the drain electrodes 206B which are paired in the same row R, the trench 216B is formed between different rows R (e.g., between different pairs of source and drain electrodes 206A and 206B in different rows R), and the trench 216C is formed between the columns C (e.g., between different pairs of source and drain electrodes 206A and 206B in the same row R). The trench 216A is disposed below the semiconductor nanosheets 214. For example, as shown in FIG. 3F, sidewalls 217s of the trench 216A are substantially flush with adjacent sidewalls 207s of a pair of the source and drain electrodes 206A and 206B. Accordingly, the semiconductor nanosheet 214 may be suspended over the dielectric layer 200 between a pair of source and drain electrodes 206A and 206B. In some embodiments, the trenches 216A and the trenches 216B are extended along the direction D2, and the trenches 216A and the trenches 216B are alternately arranged along the direction D1. The trenches 216C may be extended along the direction D1 and arranged along the direction D2. The trenches 216C cross over the trenches 216A and the trenches 216B, and the trenches 216A, 216B and 216C are connected to form a net-shaped trench, for example. In some embodiments, a depth of the trenches 216A, 216B and 216C is substantially the same. For example, the depth of the trenches 216A, 216B and 216C is in a range of 10 nm to 100 nm.

Figure 3G:
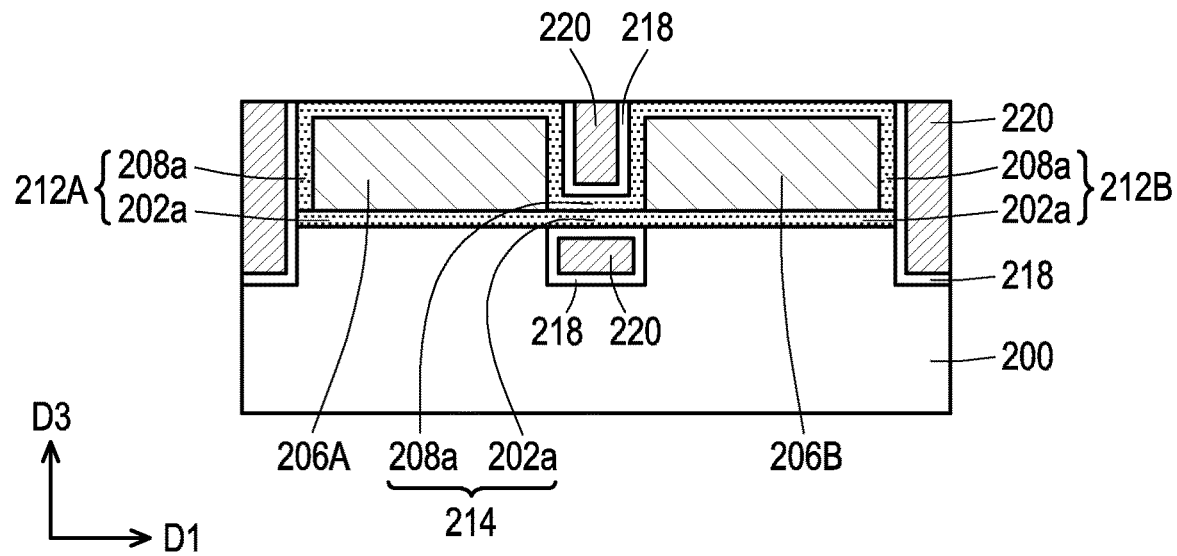

Referring to FIG. 2G and FIG. 3G, a memory material 218 and a conductive material 220 may be sequentially formed. For example, the memory material 218 is formed on the exposed surfaces of the semiconductor nanosheet 214 and the trenches 216A to 216C. The memory material 218 may be deposited conformally on the exposed surfaces of the semiconductor nanosheet 214 and bottom and sidewall surfaces of the trenches 216A to 216C. In some embodiments, the memory material 218 includes materials that are capable of switching between two different polarization directions by applying an appropriate voltage differential across the memory material 218. For example, the memory material 218 includes ferroelectric material or the like.

The memory material 218 may include $Hf_{1-x}Zr_xO_2$ (HZO), $HfO_2$, $Hf_{1-x}Er_xO$, $Hf_{1-x}La_xO$, $Hf_{1-x}Y_xO$, $Hf_{1-x}Gd_xO$, $Hf_{1-x}Al_xO$, $Hf_{1-x}Ti_xO$, $Hf_{1-x}Ta_xO$, $BaMgF_4$, $BaTiO_3$— $PbZrO$, $(Ba, Sr)TiO_3$, $Bi_4Ti_3O_{12}$, $LiNbO_3$, $LiTaO_3$, (Pb, La)$TiO_3$ such as $PbTiO_3$, $Pb(Zr, Ti)O_3$, (Pb, La)(Zr, Ti)$O_3$ such as $PbZrO_3$, $SrBi_2Ta_2O_9$, $Bi_{4-x}La_xTi_3O_{12}$ (BLT), $BiFeO_3$, $YMnO_3$, $YbMnO_3$, $BiMnO_3$, $Pb(Fe_{0.5}W_{0.5})_3$, $LiNbO_3$, $NaNbO_3$, $KNbO_3$, $KTaO_3$, $BiScO_3$, $BiFeO_3$, the like or a combination thereof. In some embodiments, the memory material 218 includes different ferroelectric materials or different types of memory materials. The memory material 218 may be formed by suitable fabrication techniques such as ALD, CVD, metalorganic CVD (MOCVD), PVD, thermal oxidation, UV-ozone oxidation, remote plasma atomic layer deposition (RPALD), plasma-enhanced atomic layer deposition (PEALD), molecular beam deposition (MBD), or combinations thereof.

In some embodiments, the memory material 218 has a thickness of about 1-20 nm, such as 5-10 nm. Other thickness ranges (e.g., more than 20 nm or 5-15 nm) may be applicable. In some embodiments, the memory material 218 is formed in a fully amorphous state. In alternative embodiments, the memory material 218 is formed in a partially crystalline state; that is, the memory material 218 is formed in a mixed crystalline-amorphous state and having some degree of structural order. In alternative embodiments, the memory material 218 is formed in a fully crystalline state. In some embodiments, the memory material 218 is a single layer. In alternative embodiments, the memory material 218 is a multi-layer structure. After the memory material 218 is deposited, an annealing step may be performed, so as to achieve a desired crystalline lattice structure for the memory material 218. In some embodiments, upon the annealing process, the memory material 218 is transformed from an amorphous state to a partially or fully crystalline state. In alternative embodiments, upon the annealing, the memory material 218 is transformed from a partially crystalline state to a fully crystalline state.

In alternative embodiments, the memory material 218 is replaced with a gate dielectric material. In such embodiments, the gate dielectric material includes silicon oxide, silicon nitride, silicon oxynitride, high-k dielectrics, or a combination thereof. It should be noted that the high-k dielectric materials are generally dielectric materials having a dielectric constant higher than 4, greater than about 12, greater than about 16, or even greater than about 20. The gate dielectric material may include metal oxides, metal nitrides, metal silicates, transition metal-oxides, transition metal-nitrides, transition metal-silicates, oxynitrides of metals, metal aluminates, or combinations thereof.

After forming the memory material 218, the conductive material 220 may be formed to wrap the semiconductor nanosheets 214 and fills space above the semiconductor nanosheets 214 between the source and drain electrodes 206A and 206B and the trenches 216A to 216C. In some embodiments, the conductive material 220 includes Mo, Ti, Pd, W, Co, Cr, Cu, Ni, Ta, Pt, Au, Al, TiW, TiN, TaN, WN, WCN, any other suitable metal-containing material, or a combination thereof. The conductive material 220 may be formed by a deposition process such as ALD, CVD, PVD, or the like. In some embodiments, a barrier layer (not shown) is optionally formed between the conductive material 220 and the memory material 218, so as to avoid diffusion of atoms between elements. In some embodiments, the barrier material includes TiN, TaN, TiSiN, TaSiN, WSiN, TiC, TaC, TiAlC, TaAlC, TiAlN, TaAlN, or a combination thereof.

The memory material 218 and the conductive material 220 may further formed outside the trenches 216A to 216C such as formed on the semiconductor layers 212A and 212B. Thus, after forming the memory material 218 and the conductive material 220, a planarization process (e.g., a CMP, etch back, or the like) may be performed to remove excess portions of the memory material 218 and the conductive material 220. For example, by using the semiconductor layers 212A and 212B as polish stop layers or etch stop layers, the memory material 218 and the conductive material 220 higher than surfaces (e.g., top surfaces) of the semiconductor layers 212A and 212B are removed. Thus, as shown in FIG. 2G and FIG. 3G, after removal, surfaces (e.g., top surfaces) of the memory material 218 and the conductive material 220 are substantially coplanar with surfaces (e.g., top surfaces) of the semiconductor layers 212A and 212B. In some embodiments, as shown in FIG. 2G, the conductive material 220 is net-shaped.

Figure 3H:
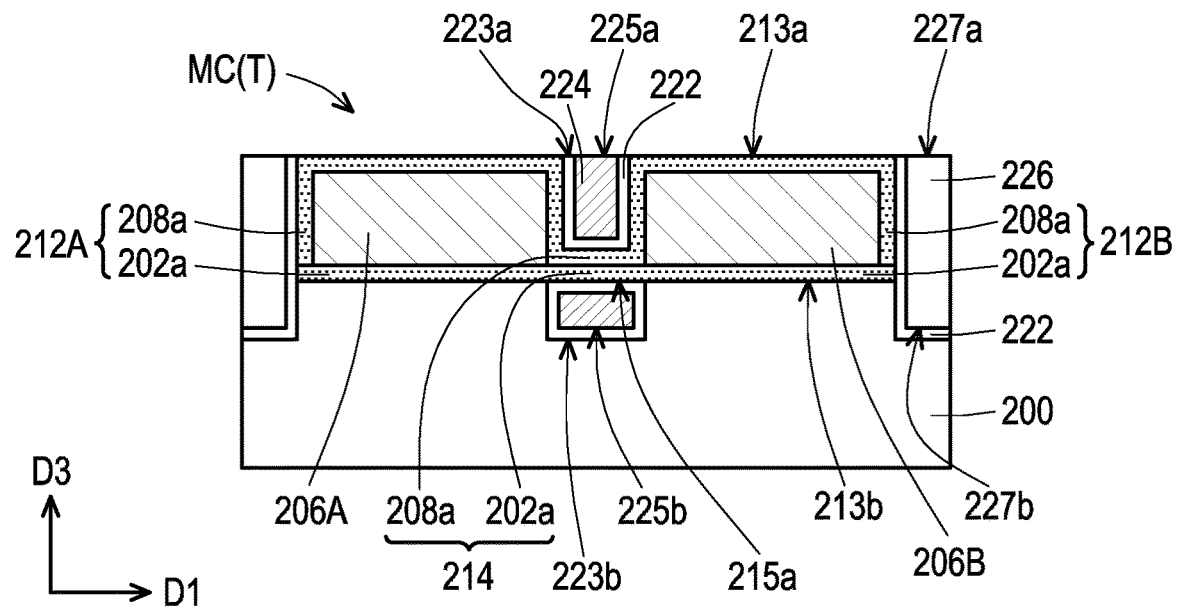

Referring to FIG. 2H and FIG. 3H, portions of the conductive material 220 in the trenches 216B are replaced with dielectric layers 226. In some embodiments, portions of the conductive material 220 in the trenches 216B are removed through an etching process by using a mask (not shown). For example, the conductive material 220 in the trenches 216B is exposed by the mask, and then the exposed conductive material 220 is removed by an anisotropic etching process such as dry etch or an isotropic etching process such as wet etch. After the removal, the dielectric layers 226 are formed to fill the trenches 216B respectively, for example. In some embodiments, the dielectric layer 226 is in direct contact with the memory layer 222 and is surrounded by the memory layer 222. In some embodiments, as shown in FIG. 2H, the dielectric layer 226 has an inverted T shape. For example, a first portion of the dielectric layer 226 surrounded by the dielectric layer 200 has a first width, and a second portion of the dielectric layer 226 between the source and drain electrodes 206A and 206B has a second width smaller than the first width. In some embodiments, the dielectric layer 226 continuously extends between the adjacent source and drain electrodes 206A and 206B in different rows R. For example, the dielectric layer 226 continuously extends between the source electrodes 206A in the first row R and the drain electrode 206B in the second row R which are immediately adjacent to each other. The dielectric layer 226 may extend in the direction D2 substantially parallel to the extending direction (e.g., the direction D2) of the gate electrode 224. The dielectric layers 226 and the gate electrodes 224 are alternately arranged along the direction D1, for example. The dielectric layers 226 may include silicon oxide, silicon nitride, silicon oxynitride, the like or a combination thereof, and dielectric layers 226 may be deposited by CVD, PVD, ALD, PECVD, the like or a combination thereof. Optionally, after deposition, a planarization process (e.g., a CMP, etch back, or the like) may be performed to remove excess portions of the dielectric materials. In some embodiments, the material of the dielectric layers 226 is substantially the same as the dielectric layer 200. In such embodiments, an interface may not exist between the dielectric layer 200 and the dielectric layers 226, and the dielectric layer 200 and the dielectric layers 226 are integrally formed. However, the disclosure is not limited thereto. The material of the dielectric layers 226 may be different from the dielectric layer 200. In some embodiments, from a top view, the dielectric layer 226 is a straight line.

After forming the dielectric layers 226, the remained memory material 218 in the trenches 216A, 216B and 216C and the remained conductive material 220 in the trenches 216A and 216C are referred to as a memory layer 222 and a gate electrode 224, respectively. As shown in FIG. 3H and FIG. 4A, the gate electrode 224 wraps around the semiconductor nanosheet 214 and is disposed between the source and drain electrodes 206A and 206B, for example. In some embodiments, as shown in FIG. 2H, the gate electrode 224 has an inverted T shape. For example, a first portion of the gate electrode 224 (e.g., below the semiconductor nanosheet 214) surrounded by the dielectric layer 200 has a first width, and a second portion of the gate electrode 224 (e.g., above the semiconductor nanosheet 214) between the source and drain electrodes 206A and 206B has a second width smaller than the first width. In some embodiments, the gate electrode 224 continuously extends between the source and drain electrodes 206A and 206B of plural pairs in the same row R. For example, the gate electrode 224 is disposed between the source electrodes 206A and the drain electrodes 206B which are paired in the same row R. In addition, the gate electrode 224 may further extend between the source electrodes 206A and/or between the drain electrodes 206B in the same row R. In such embodiments, the gate electrode 224 is shaped as a net and has a cross shape at an intersection 228A of the source and drain electrodes 206A and 206B in the same row R. In some embodiments, as shown in FIG. 2H, an outer sidewall of the gate electrode 224 is substantially flush with an inner sidewall of the memory layer 222 surrounding the dielectric layer 226. In some embodiments, the dielectric layer 226 is electrically isolated the gate electrodes 224 in different rows R. The dielectric layer 226 is in direct contact with the gate electrode 224, for example.

In some embodiments, the memory layer 222 is continuously disposed along with the gate electrode 224. The memory layer 222 is disposed between the gate electrode 224 and the semiconductor nanosheet 214, between the gate electrode 224 and the semiconductor layer 212A, between the gate electrode 224 and the semiconductor layer 212B and between the gate electrode 224 and the dielectric layer 200, for example. In some embodiments, the memory layer 222 is in direct contact with the gate electrode 224, the semiconductor nanosheet 214, the semiconductor layer 212A, the semiconductor layer 212B and the dielectric layer 200. In some embodiments, the memory layer 222 is further disposed between and in direct contact with the dielectric layer 200 and the dielectric layer 226. For example, the memory layer 222 surrounds the dielectric layer 226. In some embodiments, the memory layer 222 is also referred to as a gate dielectric layer.

In the resulting structure, first surfaces (e.g., top surfaces) 223a, 225a, 213a, 227a of the memory layer 222, the gate electrode 224, the semiconductor layers 212A, 212B (i.e., the semiconductor layers 208a of the semiconductor layers 212A, 212B) and the dielectric layer 226 may be substantially coplanar (e.g., within process variations). Second surfaces (e.g., bottom surfaces) 223b, 225b, 213b, 227b of the memory layer 222, the gate electrode 224, the semiconductor layers 212A, 212B (i.e., the semiconductor layers 202a of the semiconductor layers 212A, 212B) and the dielectric layer 226 are disposed opposite to the first surfaces 223a, 225a, 213a, 227a. The second surface 225b of the gate electrode 224 is substantially coplanar with the second surface 227b of the dielectric layer 226, and the second surface 223b of the memory layer 222 below the gate electrode 224 is substantially coplanar with the second surface 223b of the memory layer 222 below the dielectric layer 226, for example. The second surfaces 213b of the semiconductor layers 212A, 212B (i.e., the semiconductor layers 202a of the semiconductor layers 212A, 212B) may be substantially coplanar with a surface 215a (e.g., bottom surface) of the semiconductor nanosheet 214, and may be disposed between the first and second surfaces 223a and 223b of the memory layer 222 and between the first and second surfaces 225a and 225b of the gate electrode 224.

Figure 5A:
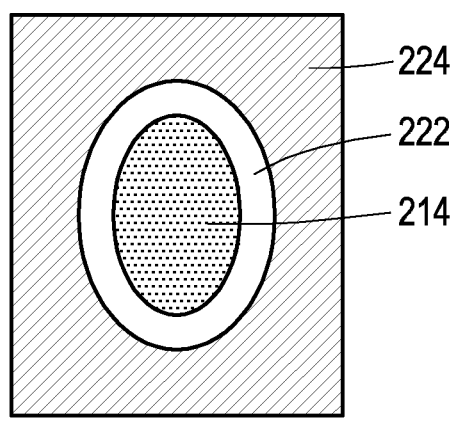
FIG. 5A to FIG. 5E are cross-sectional views taken along a cross section line II-II' in FIG. 4A.
Figure 5B:
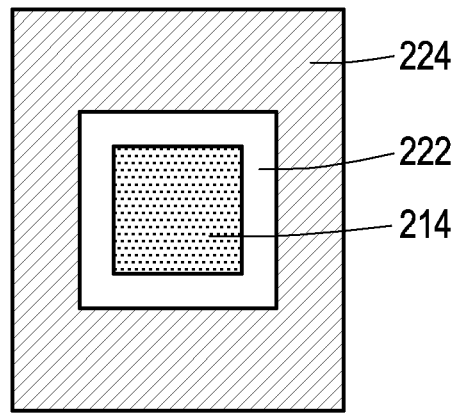
Figure 5C:
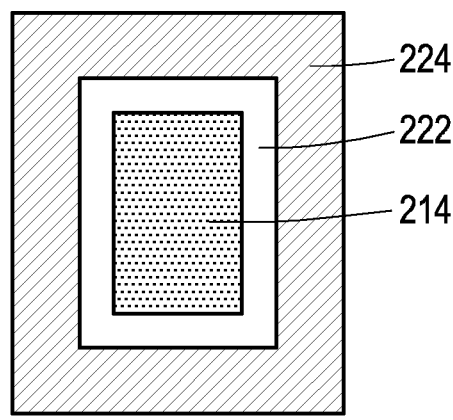
Figure 5D:
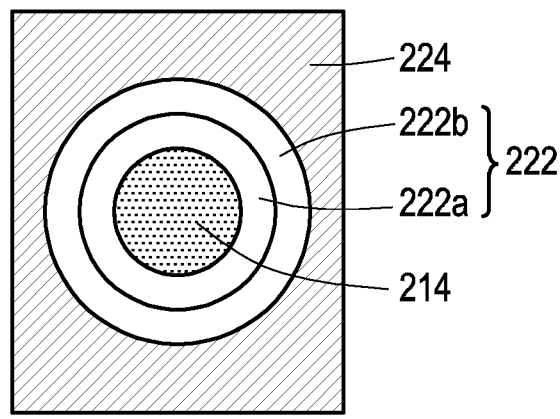
Figure 5E:
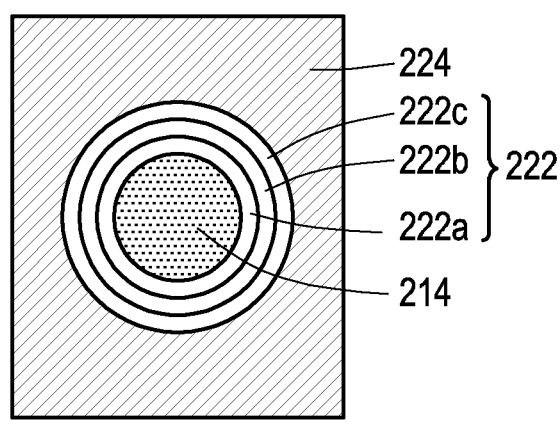

In some embodiments, the cross-sectional view of the semiconductor nanosheet 214 (i.e., channel layer) is circular (as shown in FIG. 4B). However, the disclosure is not limited thereto. The semiconductor nanosheet 214 may have any suitable cross-sectional view such as oval (as shown in FIG. 5A), square (as shown in FIG. 5B) and rectangular (as shown in FIG. 5C). In some embodiments, the memory layer 222 is illustrated as a single layer as shown in FIG. 4B to FIG. 5C. However, the disclosure is not limited thereto. In alternative embodiments, as shown in FIG. 5D and FIG. 5E, the memory layer 222 is a multi-layer structure. For example, the memory layer 222 includes a plurality of sublayers 222a, 222b, 222c between the semiconductor nanosheet 214 and the gate electrode 224. The materials of the sublayers 222a, 222b, 222c may be selected based on the interfacial property to the semiconductor nanosheet 214 or the gate electrode 224. For example, the sublayer 222a is in direct contact with the semiconductor nanosheet 214, and thus it is suitable for the sublayer 222a to be electrically compatible with the semiconductor nanosheet 214. Similarly, the outermost sublayer (e.g., sublayer 222b or sublayer 222c) is in direct contact with the gate electrode 224, and thus it is suitable for the outermost sublayer (e.g., sublayer 222b or sublayer 222c) to be electrically compatible with the gate electrode 224. The sublayers 222a, 222b, 222c may have different materials or the same material with different dopants or different dopant concentration. For example, the sublayers 222a, 222b, 222c include $Hf_{1-x}Zr_xO_2$ (HZO)-based material, and rations of Hf and Zr of the sublayers 222a, 222b, 222c are different from each other.

In some embodiments, after formation of the dielectric layer 226, a memory device is formed. The memory device includes a memory array including a plurality of memory cells MC arranged in a plurality of rows R and a plurality of columns C. As shown in FIG. 2H and FIG. 3H, it is seen that each memory cell MC includes a GAA transistor (e.g., a GAA ferroelectric TFT) T with the memory layer 222. In alternative embodiments, the memory layer 222 is replaced with a gate dielectric layer including a dielectric material such as silicon oxide, silicon nitride, silicon oxynitride, and high-k dielectrics. In some embodiments, each GAA transistor T of the memory cell MC includes the gate electrode 224 (e.g., electrically connected to a word line), the source and drain electrodes 206A and 206B (e.g., electrically connected to a source line and a bit line) and the semiconductor nanosheet 214 functioning as the channel layer. The dielectric layers 200 and 226 are used for isolating memory cells MC. In some embodiments, the memory cells MC are disposed on the dielectric layer 200 and surrounded by the dielectric layer 226. The dielectric layers 200 and 226 may be collectively referred to as a dielectric structure, and thus as shown in FIG. 2H and FIG. 3H, the memory cells MC are embedded in the dielectric structure.

In some embodiments, the memory layer 222 is used to store the digital information (e.g., a bit "1" or "0") stored in the memory cell MC. In some embodiments, the GAA ferroelectric TFT is integrated into CMOS BEOL process for computing-in-memory application due to its low-temperature process. Furthermore, the GAA ferroelectric TFT may show improved electrical properties such as gate control ability, low leakage current, low resistance and high on/off current ratio.

Figure 2I:
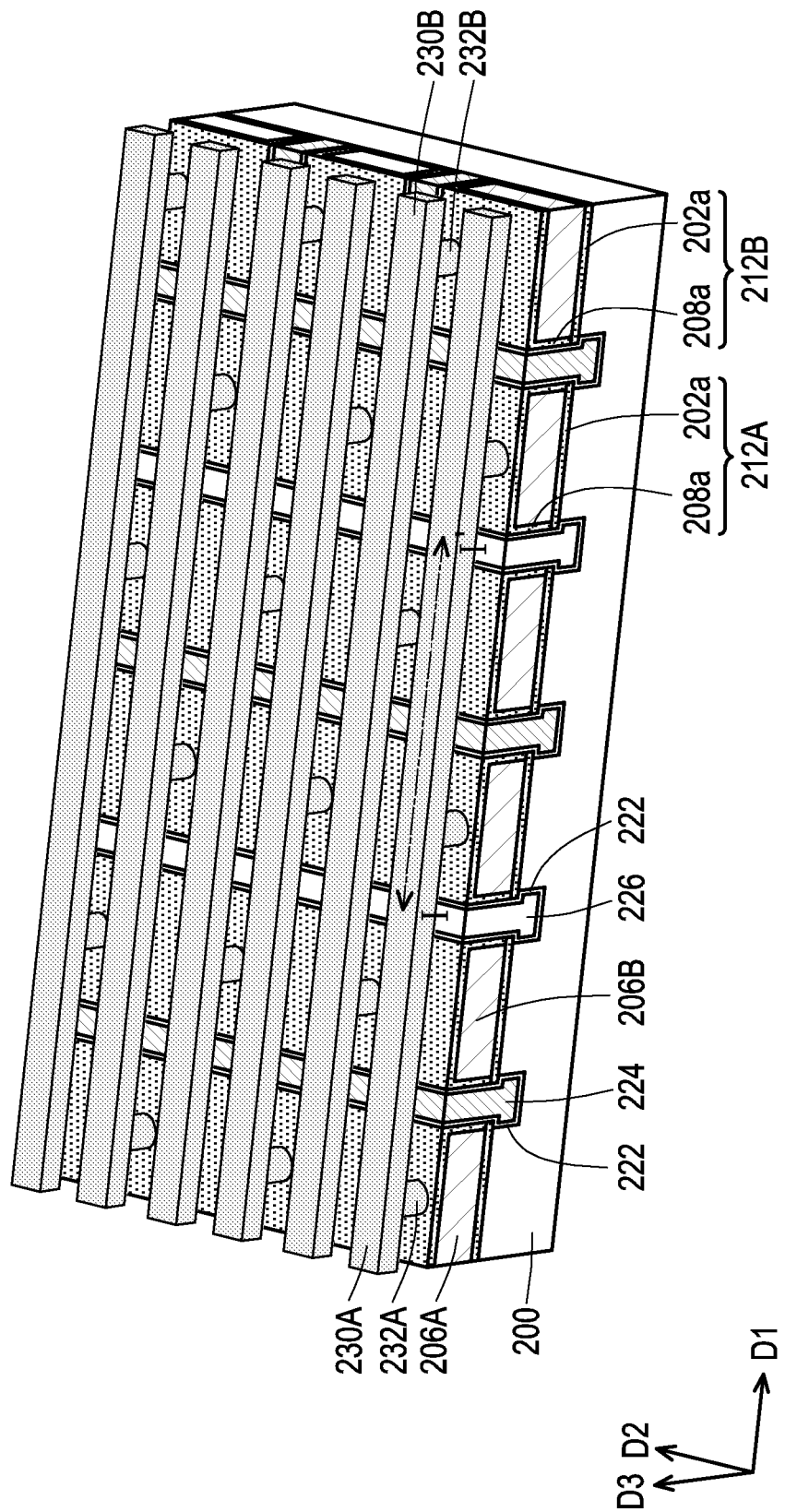
Figure 3I:
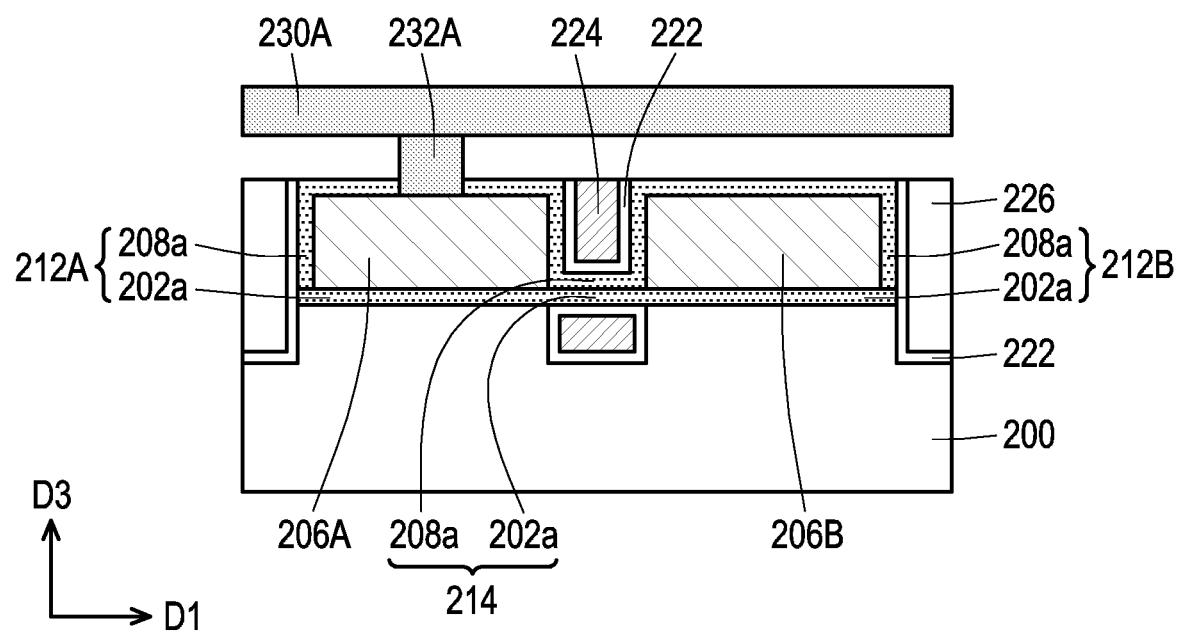

Referring to FIG. 2I and FIG. 3I, conductive lines 230A and conductive lines 230B are formed to electrically connect the source electrodes 206A and the drain electrodes 206B, respectively. In some embodiments, the conductive lines 230A are formed above the source electrodes 206A, and the conductive lines 230A are electrically connected to the source electrodes 206A through a plurality of conductive contacts 232A therebetween. The conductive lines 230B are formed above the drain electrodes 206B, and the conductive lines 230B are electrically connected to the drain electrodes 206B through a plurality of conductive contacts 232B therebetween. For example, the conductive contacts 232A penetrate the semiconductor layer 212A to electrically connect to the source electrodes 206A, and similarly, the conductive contacts 232B penetrate the semiconductor layer 212B to electrically connect to the drain electrodes 206B. In some embodiments, the conductive lines 230A, 230B are formed using a combination of photolithography and etching techniques. The conductive lines 230A, 230B may include copper, silver, gold, tungsten, aluminum, combinations thereof, or the like. In addition, the conductive lines 230A, 230B may have other configurations.

The conductive lines 230A and the conductive lines 230B may each extend in the direction D2 perpendicular to the extending direction (e.g., the direction D1) of the gate electrodes 224. The conductive lines 230A and the conductive lines 230B may be parallel to each other and alternately arranged over the dielectric layer 200 along the direction D1. In some embodiments, the conductive lines 230A, 230B and the gate electrodes 224 connect the memory device to an underlying/overlying circuitry (e.g., control circuitry) and/or signal, power, and ground lines, respectively. Other conductive contacts or vias may be formed to electrically connect the conductive lines 230A, 230B and the gate electrodes 224 to the underlying active devices of the substrate. In alternative embodiments, routing and/or power lines to and from the memory device are provided by an interconnect structure formed over the memory device.

Figure 6:
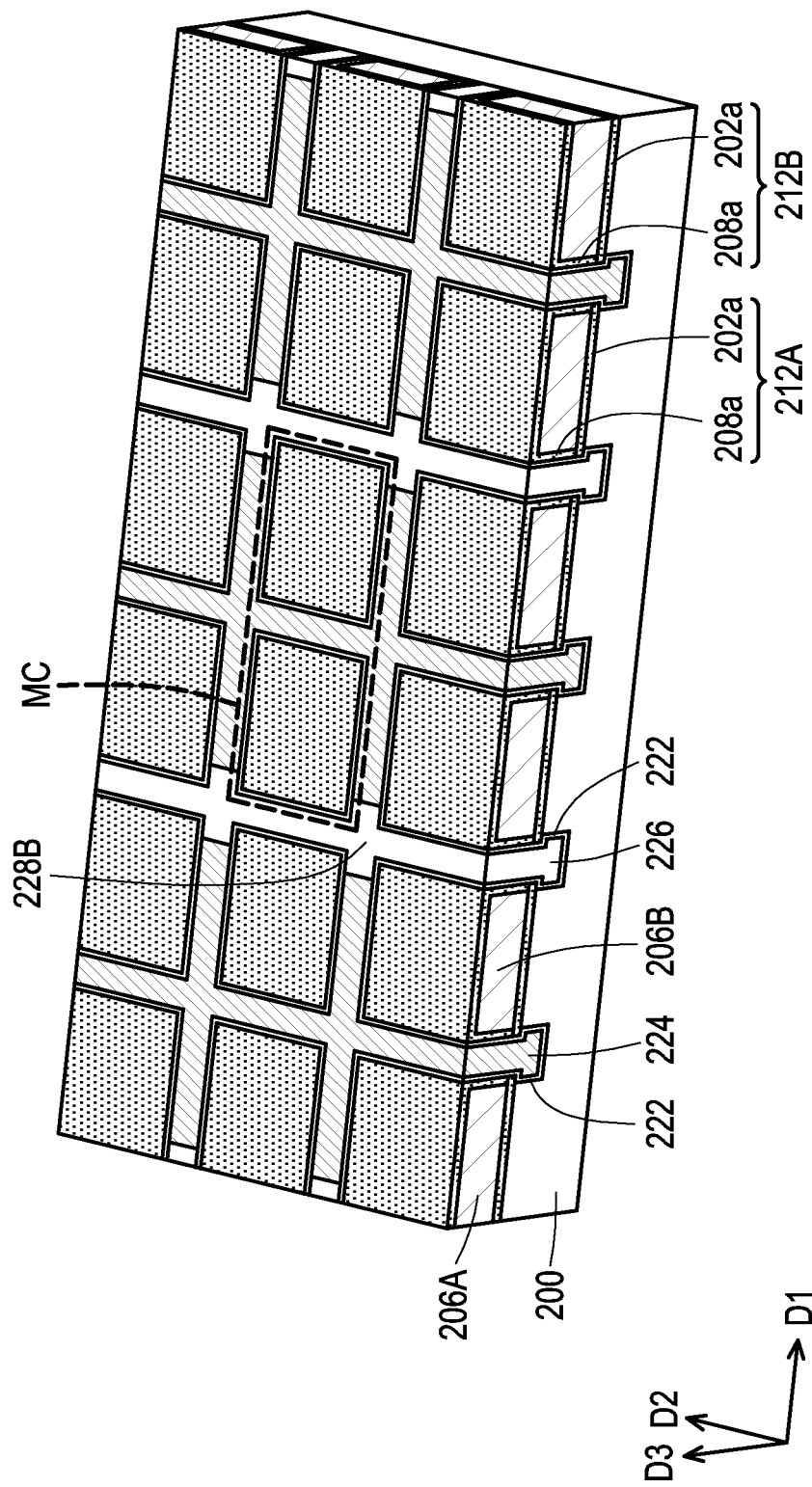
FIG. 6 is a cross-sectional view of a memory device in accordance with some alternative embodiments of the disclosure.

In some embodiments, as shown in FIG. 2H, the dielectric layers 226 are merely formed in the trenches 216B. However, the disclosure is not limited thereto. In alternative embodiments, the dielectric layers 226 further extend into the trenches 216C. In such embodiments, during the step of removal of the conductive material 220 in the trenches 216B, the conductive material 220 in portions of the trenches 216C are also removed. Thus, as shown in FIG. 6, the dielectric layer 226 has a cross shape at an intersection 228B of the source and drain electrodes 206A and 206B in different rows R. The dielectric layer 226 may further extend between the adjacent source and electrodes 206A and 206B in different rows R. In some embodiments, as shown in FIG. 6, both outer sidewalls of the dielectric layer 226 at the intersection 228B extend beyond the memory layer 222. In such embodiments, the dielectric layer 226 and the gate electrode 224 are both shaped as a net. However, the disclosure is not limited thereto. In alternative embodiments, only a first outer sidewall of the dielectric layer 226 extends beyond the memory layer 222 while a second outer sidewall opposite to the first outer sidewall of the dielectric layer 226 remains being substantially flush with the memory layer 222. In an embodiment (not shown), the dielectric layer 226 fills the trench 216C entirely, and thus the dielectric layer 226 has a net shape while the gate electrode 224 is a straight line.

Figure 7A:
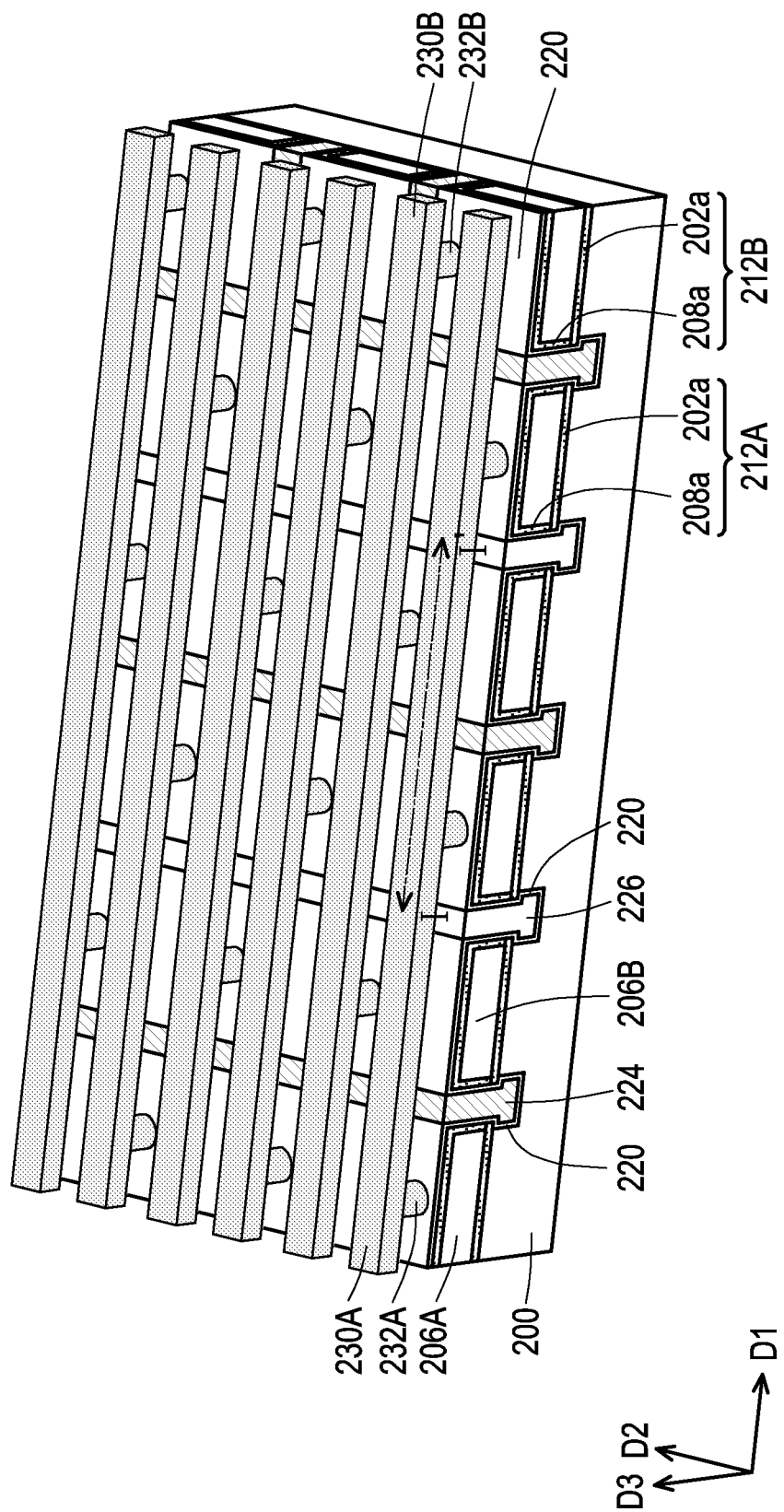
FIG. 7A is a three dimensional view of a memory device.
Figure 7B:
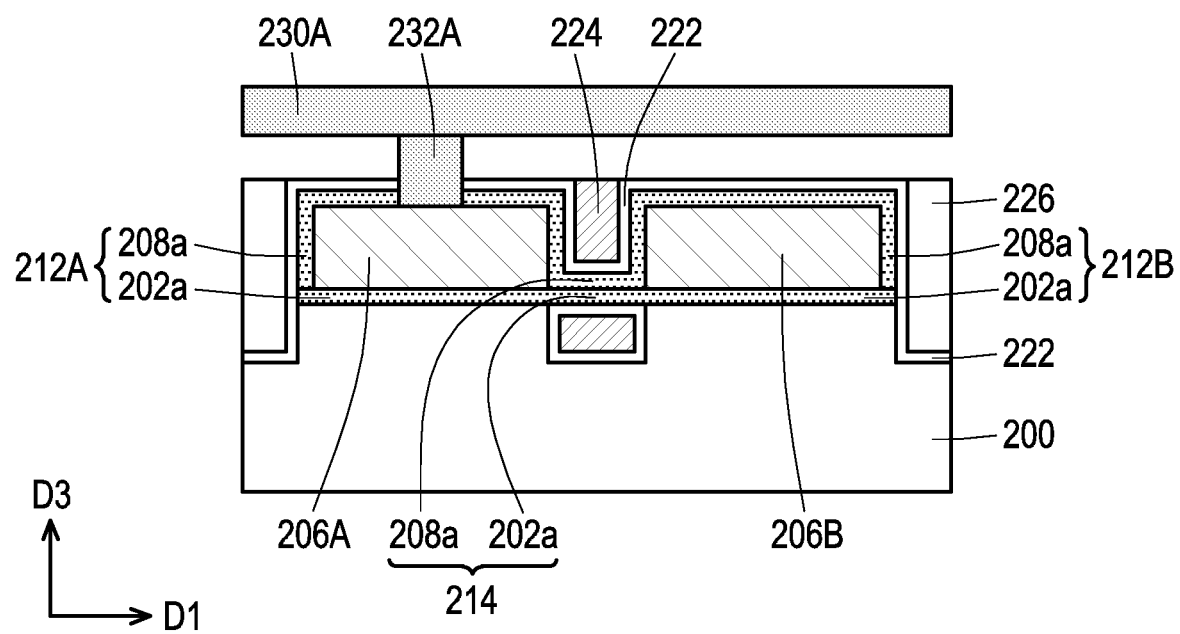
FIG. 7B is a cross-sectional view taken along cross section line I-I' in FIG. 7A.

In some embodiments, as mentioned before with reference to FIG. 2G and FIG. 3G, since the semiconductor layers 212A and 212B is used as polish stop layers or etch stop layers, surfaces (e.g., top surfaces) of the memory material 218 and the conductive material 220 are substantially coplanar with surfaces (e.g., top surfaces) of the semiconductor layers 212A and 212B. Accordingly, the formed memory layer 222 and gate electrode 224 also have the surfaces (e.g., top surfaces) 223a, 225a substantially coplanar with surfaces (e.g., top surfaces) 213a of the semiconductor layers 212A and 212B as shown in FIG. 2H and FIG. 3H. However, the disclosure is not limited thereto. In alternative embodiments, during the partial removal of the conductive material 220, the memory material 218 may serve as a polish stop layer or an etch stop layer, and thus the memory material 218 remains on the semiconductor layers 212A and 212B without removing. Accordingly, as shown in FIG. 7A and FIG. 7B, the formed memory layer 222 further extends onto the surfaces 213a (e.g., top surfaces) of the semiconductor layers 212A and 212B. In such embodiments, the memory layer 222 surrounds the dielectric layer 226, extends on the semiconductor layers 212A and 212B and wraps the semiconductor nanosheet 214 continuously. The surface 223a of the memory layer 222 is substantially flush with the surfaces 227a, 225a of the dielectric layer 226 and the gate electrode 224, for example. Furthermore, in such embodiments, as shown in FIG. 7A and FIG. 7B, the conductive contacts 232A and 232B penetrates the memory layer 222 and the semiconductor layer 212A to electrically connect to the source and drain electrodes 206A and 206B respectively.

Figure 8:
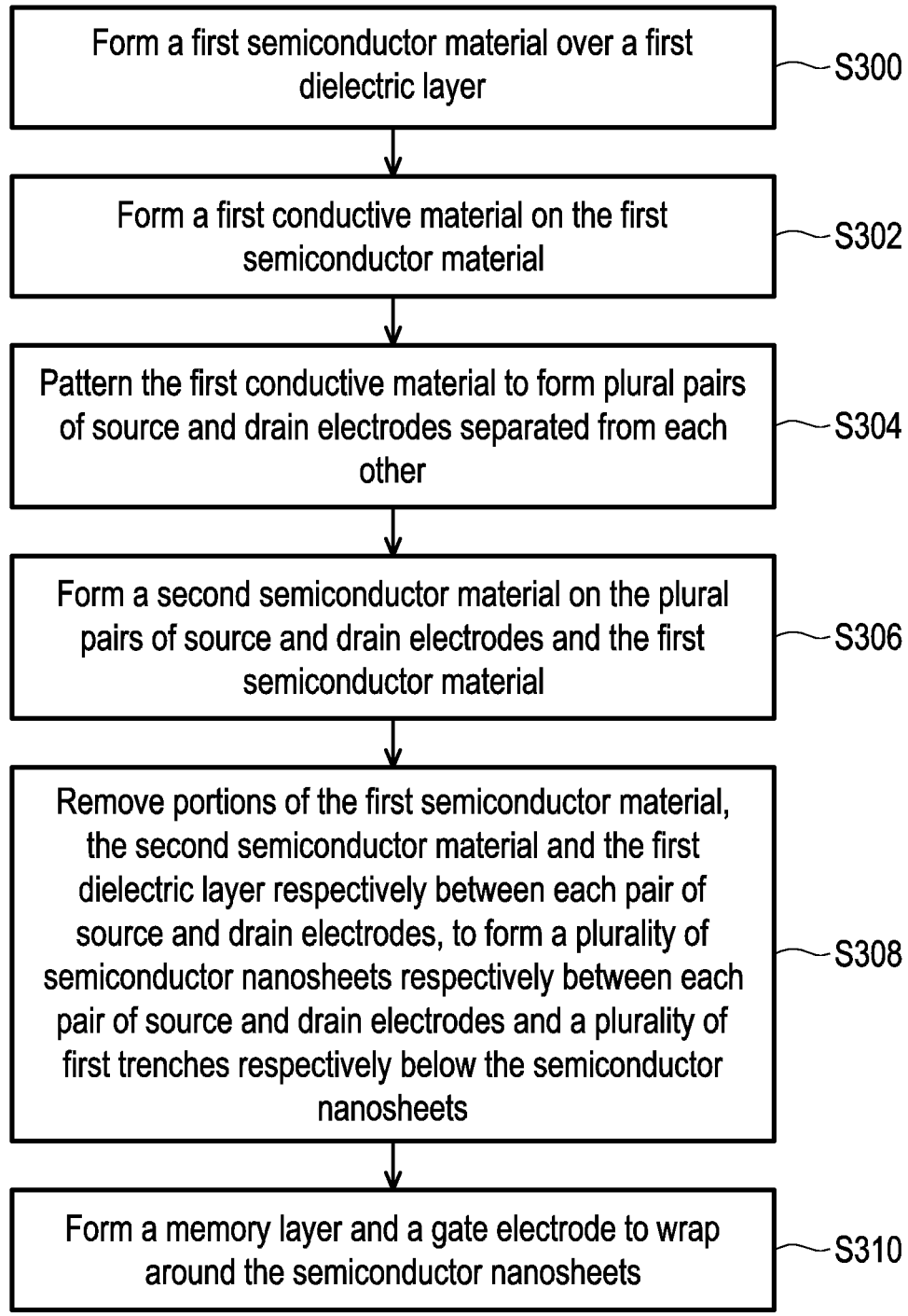
FIG. 8 illustrates a manufacturing method of a memory device in accordance with some embodiments.

FIG. 8 illustrates a manufacturing method of a semiconductor package in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S300, a first semiconductor material is formed over a first dielectric layer. FIG. 2A and FIG. 3A illustrate views corresponding to some embodiments of act S300.

At act S302, a first conductive material on the first semiconductor material. FIG. 2A and FIG. 3A illustrate views corresponding to some embodiments of act S302.

At act S304, the first conductive material is patterned to form plural pairs of source and drain electrodes separated from each other. FIG. 2B and FIG. 3B illustrate views corresponding to some embodiments of act S304.

At act S306, a second semiconductor material is formed on the plural pairs of source and drain electrodes and the first semiconductor material. FIG. 2C and FIG. 3C illustrate views corresponding to some embodiments of act S306.

At act S308, portions of the first semiconductor material, the second semiconductor material and the first dielectric layer respectively between each pair of source and drain electrodes are removed, to form a plurality of semiconductor nanosheets respectively between each pair of source and drain electrodes and a plurality of first trenches respectively below the semiconductor nanosheets. FIG. 2D to FIG. 2F and FIG. 3D to FIG. 3F illustrate views corresponding to some embodiments of act S306.

At act S310, a memory layer and a gate electrode are formed to wrap around the semiconductor nanosheets. FIG. 2G, FIG. 2H, FIG. 3G, FIG. 3H, FIG. 6, FIG. 7A and FIG. 7B illustrate views corresponding to some embodiments of act S310.

In accordance with some embodiments of the disclosure, a transistor includes a first semiconductor layer, a second semiconductor layer, a semiconductor nanosheet, a gate electrode and source and drain electrodes. The semiconductor nanosheet is physically connected to the first semiconductor layer and the second semiconductor layer. The gate electrode wraps around the semiconductor nanosheet. The source and drain electrodes are disposed at opposite sides of the gate electrode. The first semiconductor layer surrounds the source electrode, the second semiconductor layer surrounds the drain electrode, and the semiconductor nanosheet is disposed between the source and drain electrodes.

In accordance with some embodiments of the disclosure, a memory device includes a plurality of memory cells. The memory cells include plural pairs of source and drain electrodes, a plurality of semiconductor nanosheets, a gate electrode and a memory layer. The source and drain electrodes are separated from each other. Each semiconductor nanosheet is disposed between each pair of source and drain electrodes. The gate electrode continuously wraps around the semiconductor nanosheets, wherein the gate electrode is continuously disposed between the plural pairs of source and drain electrodes. The memory layer is disposed between the gate electrode and the semiconductor nanosheets.

In accordance with some embodiments of the disclosure, a manufacturing method of a memory device includes at least the following steps. A first semiconductor material is formed over a first dielectric layer. A first conductive material is formed on the first semiconductor material. The first conductive material is patterned to form plural pairs of source and drain electrodes separated from each other. A second semiconductor material is formed on the plural pairs of source and drain electrodes and the first semiconductor material. Portions of the first semiconductor material, the second semiconductor material and the first dielectric layer respectively between each pair of source and drain electrodes are removed, to form a plurality of semiconductor nanosheets respectively between each pair of source and drain electrodes and a plurality of first trenches respectively below the semiconductor nanosheets. A memory layer and a gate electrode are formed to wrap around the semiconductor nanosheets.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor, comprising:
a first semiconductor layer, a second semiconductor layer and a semiconductor nanosheet physically connected to the first semiconductor layer and the second semiconductor layer;
a gate electrode, wrapping around the semiconductor nanosheet; and
source and drain electrodes at opposite sides of the gate electrode, wherein the first semiconductor layer surrounds the source electrode, the second semiconductor layer surrounds the drain electrode, and the semiconductor nanosheet is disposed between the source and drain electrodes, wherein the first semiconductor layer is disposed on opposite surfaces and sidewall surfaces of the source electrode, and the second semiconductor layer is disposed on opposite surfaces and sidewall surfaces of the drain electrode.

2. The transistor of claim 1, further comprising a memory layer between the gate electrode and the semiconductor nanosheet, wherein a surface of the gate electrode is substantially coplanar with surfaces of the memory layer, the first semiconductor layer and the second semiconductor layer.

3. The transistor of claim 2, further comprising a dielectric layer surrounded by the memory layer, wherein a surface of the dielectric layer is substantially coplanar with the surfaces of the memory layer, the first semiconductor layer, the second semiconductor layer and the gate electrode.

4. The transistor of claim 1, further comprising a memory layer between the gate electrode and the semiconductor nanosheet and a dielectric layer surrounded by the memory layer, wherein a surface of the dielectric layer is substantially coplanar with surfaces of the memory layer and the gate electrode.

5. The transistor of claim 4, wherein the first semiconductor layer is disposed between the memory layer and the source electrode, and the second semiconductor layer is disposed between the memory layer and the drain electrode.

6. The transistor of claim 1, further comprising a dielectric layer below the source and drain electrodes, wherein the gate electrode has a first width in the dielectric layer and a second width between the source and drain electrodes, and the second width is smaller than the first width.

7. A memory device, comprising:
a plurality of memory cells, comprising:
plural pairs of source and drain electrodes separated from each other;
a plurality of semiconductor nanosheets, wherein each semiconductor nanosheet is disposed between each pair of source and drain electrodes;
a gate electrode, continuously wrapping around the semiconductor nanosheets, wherein the gate electrode is continuously disposed between the plural pairs of source and drain electrodes; and
a memory layer, between the gate electrode and the semiconductor nanosheets, wherein the gate electrode has a cross shape at an intersection of the plural pairs of source and drain electrodes.

8. The memory device of claim 7, further comprising a plurality of semiconductor layers respectively surrounding the plural pairs of source and drain electrodes, wherein the semiconductor layers are physically connected to the semiconductor nanosheets, respectively.

9. The memory device of claim 8, wherein a surface of the gate electrode is substantially coplanar with surfaces of the memory layer and the semiconductor layers.

10. The memory device of claim 7, further comprising a first dielectric layer and a second dielectric layer on the first dielectric layer, wherein the memory cells are disposed on the first dielectric layer, and a first surface of the second dielectric layer is substantially coplanar with first surfaces of the memory layer and the gate electrode.

11. The memory device of claim 10, wherein the memory layer is further disposed between the first dielectric layer and the second dielectric layer.

12. The memory device of claim 10, wherein the gate electrode and the second dielectric layer are extended along a first direction respectively, and the gate electrode and the second dielectric layer are arranged along a second direction substantially perpendicular to the first direction.

13. The memory device of claim 10, wherein the second dielectric layer is in direct contact with the gate electrode.

14. The memory device of claim 10, wherein the second dielectric layer has a cross shape at an intersection of the plural pairs of source and drain electrodes.

15. The transistor of claim 7, wherein the memory layer includes a ferroelectric material.

16. A manufacturing method of a memory device, comprising:
forming a first semiconductor material over a first dielectric layer;
forming a first conductive material on the first semiconductor material;
patterning the first conductive material to form plural pairs of source and drain electrodes separated from each other;
forming a second semiconductor material on the plural pairs of source and drain electrodes and the first semiconductor material;
removing portions of the first semiconductor material, the second semiconductor material and the first dielectric layer respectively between each pair of source and drain electrodes, to form a plurality of semiconductor nanosheets respectively between each pair of source and drain electrodes and a plurality of first trenches respectively below the semiconductor nanosheets; and
forming a memory layer and a gate electrode to wrap around the semiconductor nanosheets.

17. The method of claim 16, wherein removing the portions of the first semiconductor material, the second semiconductor material and the first dielectric layer between each pair of source and drain electrodes comprises:
removing the first semiconductor material, the second semiconductor material and the first dielectric layer respectively disposed between the source and drain electrodes of each pair, to form the semiconductor nanosheets and the first trenches; and
removing the first semiconductor material, the second semiconductor material and the first dielectric layer between the plural pairs of source and drain electrodes, to form second trenches, wherein the first trenches and the second trenches are alternately arranged.

18. The method of claim 17, wherein the first semiconductor material, the second semiconductor material and the first dielectric layer between the plural pairs of source and drain electrodes are entirely removed.

19. The method of claim 17, wherein forming the memory layer and the gate electrode comprises:
forming a memory material over the semiconductor nanosheets and the plural pairs of source and drain electrodes; and
forming a conductive material over the memory material to wrap the semiconductor nanosheets and fill the first trenches.

20. The method of claim 19, wherein the memory material and the conductive material further form in the second trenches, and the method further comprises replacing the conductive material in the second trenches with a dielectric material.

* * * * *